United States Patent [19]

Suzuki et al.

[11] Patent Number: 5,471,084

[45] Date of Patent: Nov. 28, 1995

[54] MAGNETORESISTIVE ELEMENT AND MANUFACTURING METHOD THEREFOR

[75] Inventors: Yasutoshi Suzuki, Okazaki; Kenichi Ao, Tokai; Hirofumi Uenoyama, Shikatsu; Hiroki Noguchi, Nishio; Koji Eguchi, Obu; Ichiro Ito, Anjo; Yoshimi Yoshino, Inuyama, all of Japan

[73] Assignee: Nippondenso Co., Ltd., Kariya, Japan

[21] Appl. No.: 94,142

[22] PCT Filed: Dec. 3, 1992

[86] PCT No.: PCT/JP92/01581

§ 371 Date: Jul. 30, 1993

§ 102(e) Date: Jul. 30, 1993

[87] PCT Pub. No.: WO93/11569

PCT Pub. Date: Jun. 10, 1993

[30] Foreign Application Priority Data

| Dec. 3, 1991 | [JP] | Japan | 3-319444 |
| Jan. 31, 1992 | [JP] | Japan | 4-016834 |
| Mar. 27, 1992 | [JP] | Japan | 4-071489 |
| Oct. 22, 1992 | [JP] | Japan | 4-284683 |
| Oct. 27, 1992 | [JP] | Japan | 4-289099 |
| Nov. 25, 1992 | [JP] | Japan | 4-314847 |

[51] Int. Cl.$^6$ ................................ H01L 27/22
[52] U.S. Cl. .................. 257/421; 257/427; 257/751; 257/765; 257/775
[58] Field of Search ................. 257/427, 641, 257/421, 773, 775, 751, 765

[56] References Cited

U.S. PATENT DOCUMENTS

| 4,091,406 | 5/1978 | Lewis | 257/641 |
| 4,945,397 | 7/1990 | Schuetz | 257/427 |
| 5,004,064 | 4/1991 | Yoshino et al. | |
| 5,198,884 | 3/1993 | Yano et al. | 257/641 |
| 5,262,666 | 11/1993 | Yoshino et al. | 257/427 |

FOREIGN PATENT DOCUMENTS

| 57-126187 | 8/1982 | Japan . | |
| 57-149782 | 9/1982 | Japan . | |
| 58-51523 | 3/1983 | Japan | 257/641 |
| 59-110122 | 6/1984 | Japan | 257/641 |
| 60-101968 | 6/1985 | Japan | 257/775 |
| 63-293916 | 11/1988 | Japan | 257/775 |
| 1125882 | 5/1989 | Japan . | |
| 1200683 | 8/1989 | Japan . | |
| 1200682 | 8/1989 | Japan . | |
| 228385 | 1/1990 | Japan . | |
| 3196586 | 8/1991 | Japan . | |

*Primary Examiner*—Sara W. Crane
*Assistant Examiner*—Courtney A. Bowers
*Attorney, Agent, or Firm*—Cushman, Darby & Cushman

[57] ABSTRACT

This invention relates to a magnetoresistive element used for a magnetic sensor, etc. A ferromagnetic magnetoresistive element thin film is formed so as to be electrically connected to and so as to overlap the upper end portion of an aluminum wiring metal on a substrate. Through using a vacuum heat treatment with a temperature between 350° and 450° C., a Ni—Al-based alloy is formed at the overlapping portion. Therefore, even when a surface protection film of silicon nitride is subsequently formed by plasma CVD on the substrate, the alloy prevents the nitriding of the upper end portion of the aluminum wiring metal. Accordingly, the surface can be protected from moisture by the silicon nitride film without increasing the contact resistance between the magnetoresistive element thin film and the wiring metal. Instead of the Ni—Al-based alloy, other conductive metals such as TiW, TiN, Ti, Zr, or the like may be used. Also, the surface protection film may be a multi-layered film having a first film containing no nitrogen, such as a silicon oxide film, and a second film of silicon nitride film formed on the first film.

8 Claims, 33 Drawing Sheets

MAGNETORESISTIVE ELEMENT AND MANUFACTURING METHOD THEREFOR

DESCRIPTION

1. Technical Field

This invention relates to a magnetoresistive element and a manufacturing method therefor.

2. Background Art

A magnetoresistive element as disclosed in Japanese Laid-open Patent Application No. 1-125882 has been conventionally used for a magnetic sensor, etc.

Generally, in a magnetic sensor using a thin film of magnetoresistive element, as shown in FIG. 25, an insulating film 4 is formed on a monocrystal silicon substrate 1 having a circuit element, aluminum wiring metal 9 is formed on the insulating film 4, and a thin film of ferromagnetic magnetoresistive element 10 formed of Ni—Fe, Ni—Co or the like is formed on the aluminum wiring metal 9. The magnetoresistive element thin film 10 is disposed on the aluminum wiring metal 9 for the following reason. If the magnetic-resistance element thin film 10 is priorly formed, a patterning of the aluminum wiring metal 9 is subsequently carried out, and thus an etching of the magnetoresistive element thin film 10 must be considered at the patterning step.

The thin film such as Ni—Fe, Ni—Co or the like is very active, so that it is liable to be oxidized and damaged. Therefore, a surface protection film 11 formed of silicon nitride which can be formed at a low temperature is formed on the magnetoresistive element thin film 10. It is formed in the following manner, for example. The monocrystal silicon substrate which is an object on which elements are laminated is inserted into a vacuum chamber, raw gas (monosilane, nitrogen, ammonia, etc.) flows into the vacuum chamber at 200° to 400° C., and plasma is excited with a high-frequency power source to deposit a silicon nitride film (surface protection film 11). Through this process, the surface protection film can be formed without oxidizing the magnetoresistive element thin film 10, and in addition the silicon nitride film having defects such as pinholes, can be formed as the surface protection film. The bond resistance (contact resistance) between the magnetoresistive element thin film 10 and the aluminum wiring metal 9 is ordinarily about 1Ω, however, it is experimentally proved that if a silicon nitride film having excellent moisture resistant property is deposited as the surface protection film 11, the bond resistance would be varied to several tens to 1MΩ after deposition of the silicon nitride. For the magnetic sensor as shown in FIG. 25, the result of the contact resistance of Ni—Co/Al which is measured before and after a plasma silicon nitride film (P—SiN film) serving as the surface protection film 11 is formed is shown in FIG. 26. It is apparent from FIG. 26 that in comparison with the contact resistance before the plasma silicon nitride film is formed, the contact resistance after the plasma silicon nitride film is formed is increased in two or more orders. This indicates a failure in the electrical connection of Ni—Co/Al.

An object of this invention is to provide a magnetoresistive element and a manufacturing method for the magnetoresistive element in which an increase in the contact resistance between a magnetoresistive element thin film and a wiring metal due to formation of a surface protection film can be inhibited,

DISCLOSURE OF INVENTION

In order to clarify the cause of an increase in the contact resistance due to formation of the silicon nitride as described above, the variation of the contact resistance is measured in the same manner under an $NH_3$ gas atmosphere which is one of atmosphere gases at the formation time of the plasma silicon nitride. The result is shown in FIG. 27. The contact resistance of Ni—Co/Al is varied in about two orders by exposing it to the $NH_3$ gas atmosphere in comparison with that before exposure to the $NH_3$ gas atmosphere, and thus proving that the increase in contact resistance after the plasma silicon nitride film is formed is mainly caused by the $NH_3$ gas.

FIG. 28 shows an SIMS analysis result of a bond portion (contact portion) between the magnetoresistive element thin film 10 and the aluminum wiring metal 9 after the plasma silicon nitride film is formed, which was measured using a secondary ion mass spectrometer.

It is proved from FIG. 28 that a large amount of aluminum nitride (AlN) exists at the contact portion. The surface of the aluminum wiring metal 9 is exposed to the gas (particularly, ammonia, nitrogen), which is indispensable for the formation of the surface protection film (silicon nitride) 11, at high temperature. Even at the contact portion, which is covered with the ferromagnetic magnetoresistive element thin film 10 thereon, the gas containing nitrogen penetrates through the ferromagnetic magnetoresistive element thin film 10 and reaches the surface of the aluminum wiring metal 9, and thus it is considered that the aluminum nitride 15 is formed as shown in a schematic diagram of FIG. 29. The aluminum nitride 15 has an insulation property, and this causes the contact resistance to be increased.

In order to attain the above object, the magnetoresistive element according to this invention includes a substrate, aluminum-based wiring metal disposed on the substrate, a nickel-based magnetoresistive element thin film which is electrically connected to the aluminum-based wiring metal, a barrier film which is formed at the upper portion of the connection portion between the aluminum-based wiring metal and the magnetoresistive element thin film, and a surface protection film formed of nitride which covers the magnetoresistive element thin film.

In particular, the barrier film is characterized by comprising an alloy layer formed at the connecting portion between the aluminum-based wiring metal and the magnetoresistive element thin film by conducting a heat treatment before the surface protection film is formed. That is, the heat treatment is conducted before the surface protection film is formed, whereby the magnetoresistive element thin film is diffused into the aluminum-based wiring metal to form the alloy layer of the aluminum-based wiring metal and the magnetoresistive element thin film. Accordingly, the alloy layer of the aluminum-based wiring metal and the magnetoresistive element thin film as described above is formed at the upper portion of the aluminum-based wiring metal at the connecting portion, so that under the gas atmosphere containing nitrogen at the film formation time of the surface protection film, the alloy layer prevents the penetration of the nitrogen therethrough and prohibits the formation of insulating aluminum nitride at the connection portion between the magnetic-resistance element thin film and the aluminum-based wiring metal.

When the magnetoresistive element thin film and the aluminum-based wiring metal are disposed and connected to each other on the substrate, both are electrically connected to each other while another conductor is interposed therebetween as the barrier film. Here, in a case where a conductor for connection is disposed on the upper layer side of the aluminum-based wiring metal, the connection conductor is required to inhibit nitrogen from passing therethrough. On the other hand, in a case where the connection conductor is disposed at the lower layer of the aluminum-based wiring metal, penetration of the gas containing nitrogen at the contact portion is prevented by the aluminum-based wiring metal serving as the upper layer side. Further, in a case where the connection conductor is disposed at the lower layer side of the magnetoresistive element thin film, non-aluminum-based conductor is selected as the connection conductor. As the non-aluminum-based conductor, a material which is not nitride or if it is nitride, a nitride film that becomes conductive is selected. With this construction, even when exposed to the gas atmosphere containing nitrogen in the process of forming the silicon nitride film, no insulating AlN is formed at the contact portion between the magnetoresistive element thin film and the connection conductor and the contact portion between the connection conductor and the aluminum-based wiring metal.

Further, the following manufacturing method may be adopted. That is, the magnetoresistive element thin film and the aluminum-based wiring metal are disposed and electrically connected to each other on the substrate, the connection portion between the magnetoresistive element thin film and the aluminum-based wiring metal is covered by a silicon oxide film or an amorphous silicon film, and the silicon oxide film or the amorphous silicon film is covered by a surface protection film formed of a silicon nitride film. With this construction, invasion of nitrogen under the gas atmosphere containing nitrogen when the silicon nitride film is formed is prevented by the silicon oxide film or the amorphous silicon film, and no AlN is formed at the contact portion between the magnetoresistive element thin film and the aluminum-based wiring metal.

BRIEF DESCRIPTION OF THE DRAWINGS

FIG. 44 is a plane view of a magnetic sensor of another modification of the fourth embodiment;

DETAILED DESCRIPTION OF THE PRESENTLY PREFERRED EMBODIMENTS

Embodiments of a magnetic sensor according to this invention will be hereunder described with reference to the accompanying drawings.

(First Embodiment)

Figure 1:
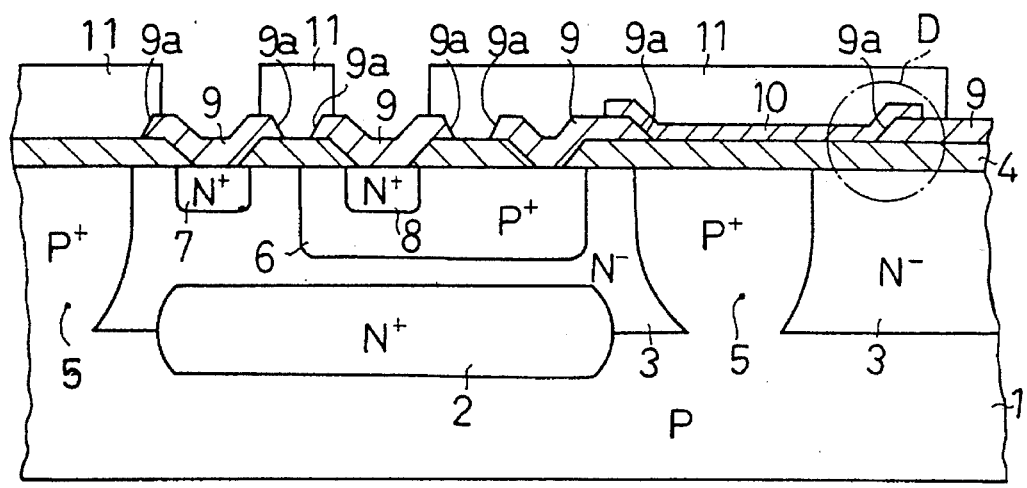
FIG. 1 is a cross-sectional sensor of a magnetic view of a first embodiment.
Figure 2:
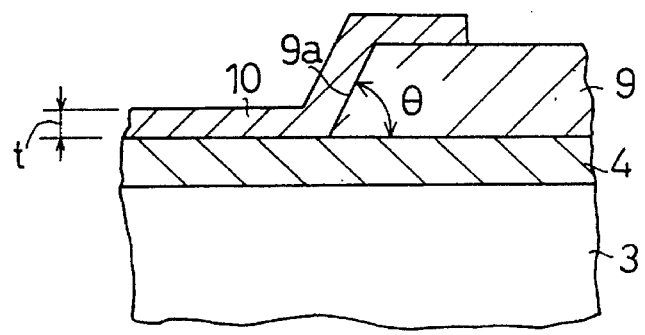
FIG. 2 is an enlarged view of a D portion of FIG. 1.
Figure 3:
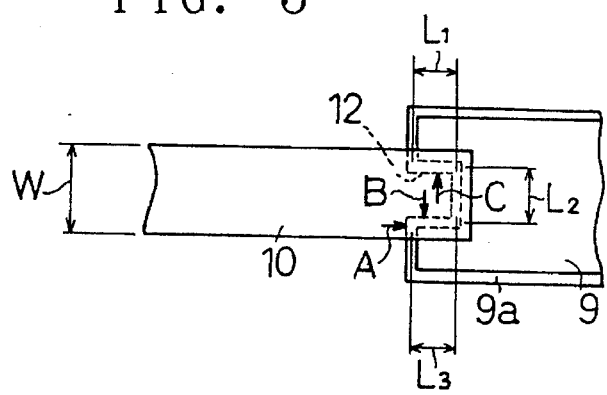
FIG. 3 is a plane view showing a contact state between a ferromagnetic magnetoresistive element thin film and an aluminum wiring metal.

FIG. 1 is a cross-sectional view of the magnetic sensor of the first embodiment. The ferromagnetic magnetoresistive element thin film 10 and the signal processing circuit are integrated on the same substrate. FIG. 2 is an enlarged view of a D portion of FIG. 1, and FIG. 3 is a plane view of the D portion.

FIGS. 4 to 7 show the manufacturing process of the magnetic sensor.

Figure 4:
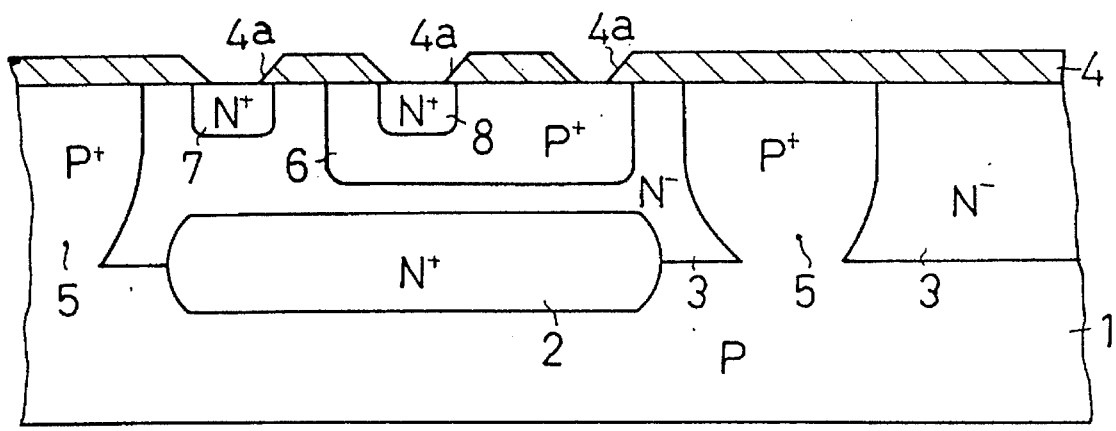
FIGS. 4 to 7 are cross-sectional views showing a manufacturing process of the magnetic sensor of the first embodiment.

First, as shown in FIG. 4, a vertical type of NPN bipolar transistor is formed on a main surface of a P-type semiconductor substrate (monocrystal silicon substrate) i using a well-known processing technique. That is, on the main surface of the P-type semiconductor substrate 1 are formed an N'-type buried layer 2 and an N⁻-type epitaxial layer 3. Further, a silicon oxide film 4 is formed on a main surface of the N⁻-type epitaxial layer 3 by a heat oxidation method or a CVD method, the silicon oxidation film 4 is subjected to a photoetching treatment by a desired circuit pattern, and P⁺-type element separation region 5, P⁺-type diffusion region 6 and N⁺-type diffusion regions 7 and 8 are formed by diffusion of impurities. That is, the N⁺-type region is formed by selectively diffusing phosphorus and the P⁺-type region is formed by selectively diffusing boron using an ion injection method or a diffusion method. Through the above processes, the vertical NPN bipolar transistor is constructed by the N⁺-type buried layer 2, the N⁻-type epitaxial layer 3, the P⁺-type diffusion region 6, and the N⁺-type diffusion regions 7 and 8, and this transistor is used to amplify a signal from the ferromagnetic magnetoresistive element thin film 10 as described later.

Figure 5:
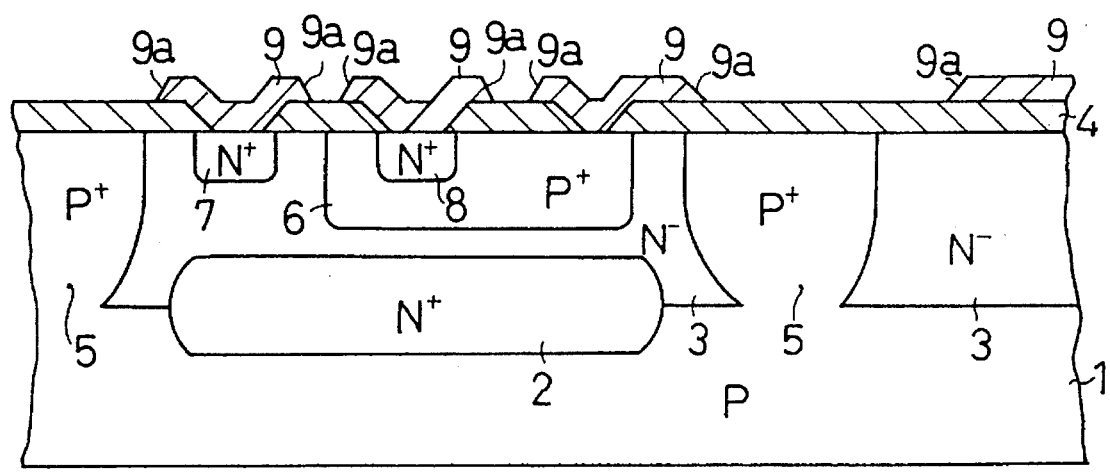

Subsequently, an opening portion 4a is selectively formed in the silicon oxide film 4 using a photolithography to form a contact portion. As shown in FIG. 5, a thin film of aluminum wiring metal 9 is deposited on the main surface of the P-type semiconductor substrate 1 by a deposition method or a sputtering method, and this aluminum wiring metal 9 is patterned by the photoetching treatment. At this time, the end portion of the aluminum wiring metal 9 is so processed that the section thereof is designed in a slant (tapered) form (as represented by a slant portion 9a in the figure). That is, a wet-type taper etching is conducted to set an inclination angle θ of the slant portion 9a below 78 degrees, for example, to 50 degrees. As shown in FIG. 2, the inclination angle θ is defined as an intersecting angle between the silicon oxide film 4 and the end surface of the aluminum wiring metal 9.

Thereafter, in order to obtain an ohmic junction between the aluminum wiring metal 9 and a circuit element (silicon) such as a bipolar transistor or the like, a heat-treatment which is called as "alumi-sinter" is-conducted, for example, at 450° C. for 30 minutes under foaming gas ($N_2+H_2$). At this time, an insulating film such as an oxide film or the like is also formed on the surface of the aluminum wiring metal 9.

Figure 6:
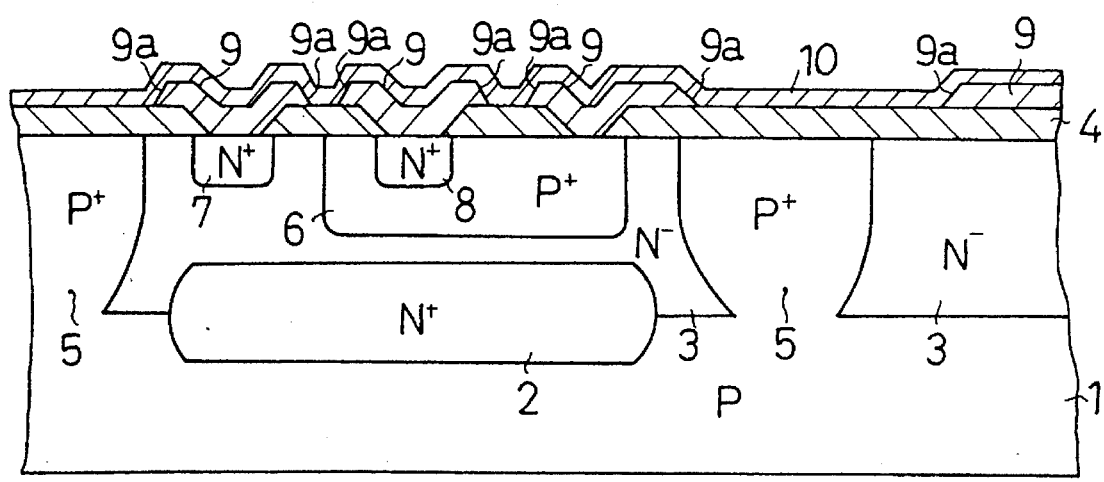

Subsequently, the P-type semiconductor substrate 1 is disposed in a vacuum chamber, and the oxide layer grown on the surface of the aluminum wiring metal 9 is etched by a plasma etching treatment of inert gas (for example, Ar gas). Thereafter, as shown in FIG. 6, the ferromagnetic magnetoresistive element thin film 10 is deposited on the silicon oxide film 4 containing the aluminum wiring metal 9 in the same vacuum chamber with keeping a vacuum state. Therefore, a metal contact containing no oxide layer is formed at the interface between the aluminum wiring metal 9 and the ferromagnetic magnetoresistive element thin film 10. The ferromagnetic magnetoresistive element thin film 10 is formed of a ferromagnetic thin film which is mainly composed of Ni and contains Fe, Co, that is, an Ni—Fe or Ni—Co thin film, and its thickness is about 500· (200 to 2000Å). In this embodiment, a Ni—Co thin film is used as the ferromagnetic magnetoresistive element thin film 10, and it is so designed as to be thinner than the aluminum wiring metal 9 (see FIG. 2).

Figure 7:
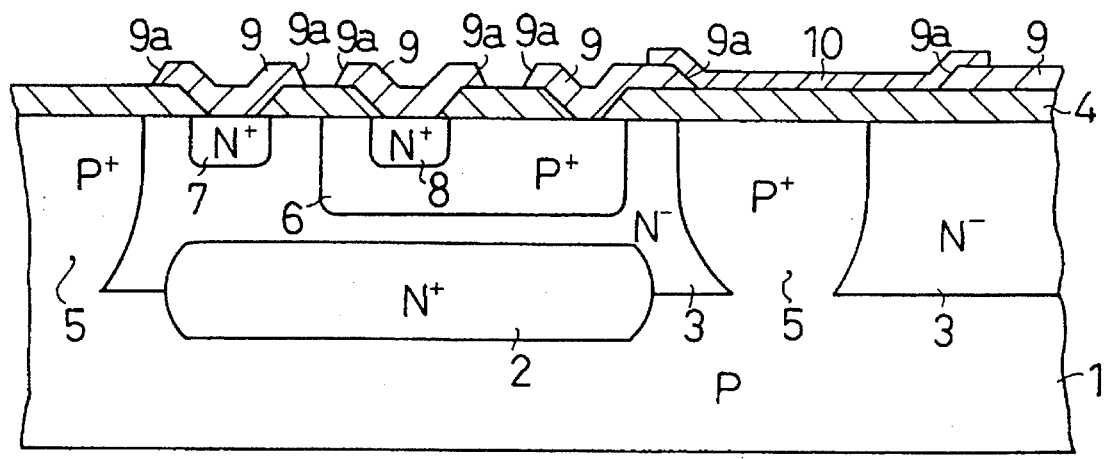

As shown in FIG. 7, the ferromagnetic magnetoresistive element thin film 10 is etched into a desired bridge pattern by the photoetching treatment. At this time, as shown in FIG. 2, the ferromagnetic magnetoresistive element thin film 10 is sufficiently overlapped with the slant portion 9a of the aluminum wiring metal 9. Through the slant portion 9a, the ferromagnetic magnetoresistive element thin film 10 and the aluminum wiring metal 9 are electrically bonded to each other. The end portion of the aluminum wiring metal 9 is designed in the tapered structure to avoid disconnection between the ferromagnetic magnetoresistive element thin film 10 and the aluminum wiring metal 9.

In this case, the ferromagnetic magnetoresistive element thin film 10 serving as a magnetic sensor is formed on the silicon oxide film 4. The ferromagnetic magnetoresistive element thin film 10 is photoetched to have 10 to 15 μm width, and the length thereof is determined on the basis of specific resistance, thickness t (see FIG. 2) and width W of the ferromagnetic magnetoresistive element thin film 10 to obtain a desired bridge resistance.

Subsequently, The P-type semiconductor substrate 1 formed with the ferromagnetic magnetoresistive element thin film 10 is subjected to the vacuum heat-treatment (vacuum annealing) for a constant time (for example, for 30 minutes). The vacuum heat-treatment is carried out under the following condition: at a temperature of 350° to 450° C. and under a vacuum (for example, below $10_{-2}$ Torr). At this time, Ni—Al-based alloy as described later is formed at the connection portion of the ferromagnetic magnetoresistive element thin film 10 and the aluminum wiring metal 9, and the ferromagnetic magnetoresistive element thin film 10 and the aluminum wiring metal 9 are electrically connected to each other through the Ni—Al-based alloy.

Thereafter, as shown in FIG. 1, a surface protection film 11 of silicon nitride is formed using a plasma CVD device. That is, the P-type semiconductor substrate 1 is kept at the temperature of about 200° to 400° C. and gas (monosilane., nitrogen, ammonia, etc.) are supplied, and plasma is excited by a high-frequency power source to deposit a silicon nitride film. Further, only a conductive terminal portion of the surface protection film 11 is etched to form an opening portion, and the magnetic sensor as shown in FIG. 1 is formed.

In the magnetic sensor thus formed, an NPN transistor formed on the main surface of the P-type semiconductor substrate 1, a PNP transistor as not shown, a diffusion resistor and a circuit element, such as a condenser, are electrically connected to one another through the aluminum wiring metal 9 to enable these elements to function as an electrical circuit. Further, the ferromagnetic magnetoresistive element thin film 10 and the circuit element formed on the main surface of the P-type semiconductor substrate 1 are protected from the outside air through the surface protection Film 11 of silicon nitride.

Next, characteristics of the connection portion between the ferromagnetic magnetoresistive element thin film 10 and the aluminum wiring metal 9 according to this embodiment will be described.

Now considering resistance Ro of the ferromagnetic magnetoresistive element thin film 10, it is represented by the sum of resistance $R_{Ni-Co}$ of the ferromagnetic magnetoresistive element thin film 10 and contact resistance Rc of the ferromagnetic magnetoresistive element thin film 10 and the aluminum wiring metal 9 (Ro=$R_{Ni-Co}$+2.Rc). Therefore, in order to set the resistance Ro of the Ferromagnetic magnetoresistive element thin film 10 to a design value, not only the precision of the pattern processing, but also the contact resistance Rc of the ferromagnetic magnetoresistive element thin film 10 and the aluminum wiring metal must be set to such a small value that the resistance value Ro is determined by only the pattern of the ferromagnetic magnetoresistive element thin film 10.

The inventor of this application experimentally investigated what determined the contact resistance of Ni—Co/Al. Conventionally, the contact resistance between the metal films (aluminum layer wiring) is varied in accordance with the contact area, and representing contact resistance rate by ρc and the area of the contact portion by A, the contact resistance Rc is represented by Rc=ρc/A. However, it is found out that in the structure of Ni—Co/Al group which the contact is made with, the slant portion in section, the contact resistance is not dependent on the area A, but dependent on only the contact area between the ferromagnetic magnetoresistive element thin film 10 and the slant portion 9a of the aluminum wiring metal. Representing the contact resistance rate of the aluminum wiring metal 9 and the ferromagnetic magnetoresistive element thin film 10 by ρ, the inclination angle of the slant portion 9a of the aluminum wiring metal 9 by θ (see FIG. 2), the thickness of smaller one of the aluminum wiring metal 9 and the ferromagnetic magnetoresistive element thin film 10 at the contact portion of the aluminum wiring metal 9 and the ferromagnetic magnetoresistive element thin film 10 (that is, the ferromagnetic magnetoresistive element thin film 10) by t, and the length of the contact portion by L, the contact resistance Rc of this structure is represented by $$Rc = \rho c \cdot \sin\theta / (t.L) \qquad \ldots (1)$$

From this, the contact resistance Rc can be set to a desired design value. From the equation (1), a device for reducing the contact resistance Rc can be made. That is, as shown in FIG. 3, a recess portion 12 is formed at the tip end portion of the aluminum wiring metal 9, and the ferromagnetic magnetoresistive element thin film 10 is disposed of the recess portion 12 to increase the value of L of the equation (1), and thus to reduce Re. As a result, L is equal to L1+L2+L3, and L can be more lengthened in comparison with a case where no recess portion 12 is provided. That is, conventionally, the contact with the aluminum wiring metal is carried out while the line width of the ferromagnetic magnetoresistive element thin film 1 (determined by the design value of the ferromagnetic resistance variation rate and the design value of the bridge resistor) is not changed and the aluminum wiring metal 9 is left band-shaped, so that the contact resistance is high. However, by forming it in a shape as shown in FIG. 3 (shape of recess portion 12), the contact resistance can be reduced in one or more orders.

The length of each side of the recess portion 12 as shown in FIG. 3 is set to two or more times of the thickness the aluminum wiring metal 9. More specifically, in this embodiment the thickness of the aluminum wiring metal 9 is set to 1 μm, and the length of each side of the recess portion 12 is set to 16 μm. Therefore, the length of each side of the recess portion 12 is set to 16 times the thickness of the aluminum wiring metal 9.

Figure 8:
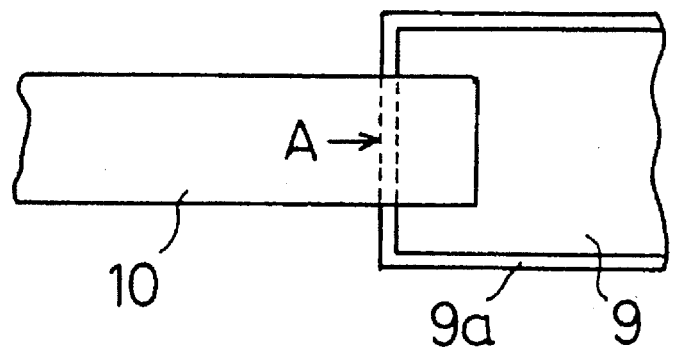
FIG. 8 is a plane view showing a contact state between conventional ferromagnetic magnetoresistive element thin film and aluminum wiring metal.

With the structure having such a recess portion 12, although the direction at the contact portion between the aluminum wiring metal 9 and the ferromagnetic magnetoresistive element thin film 10 is unidirectional (A direction in FIG. 8) in the conventional structure having no recess portion as shown in FIG. 8, in this embodiment, as shown in FIG. 3, both are contacted with each other in three directions (A, B, C directions). In other words, current Flow-in surfaces are formed in the three directions (A, B, C directions).

Figure 9:
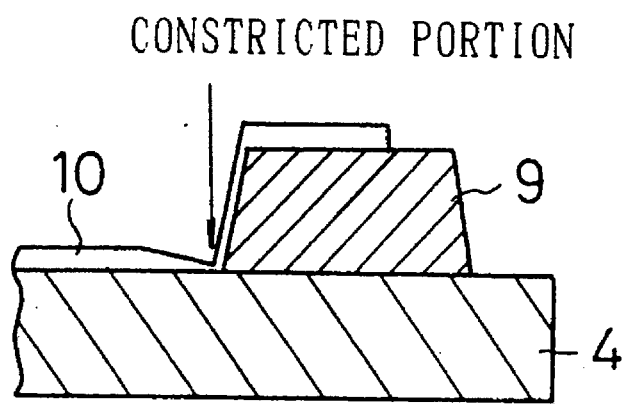
FIGS. 9 and 10 are cross-sectional views showing the contact portion between the ferromagnetic magnetoresistive element thin film and the aluminum wiring metal.
Figure 10:
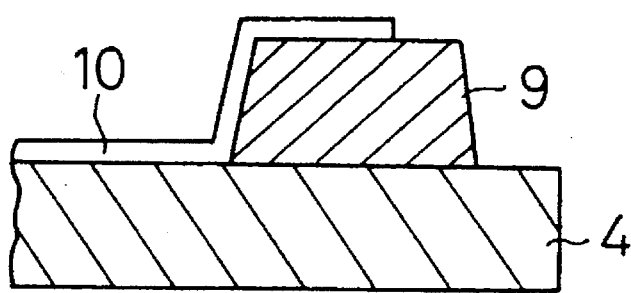

That is, in the conventional method when the aluminum wiring metal 9 and the ferromagnetic magnetoresistive element thin film 10 are contacted in one direction, the ferromagnetic magnetoresistive element thin film 10 is constricted at the end portion of the contact portion with the aluminum wiring metal 9 as shown in FIG. 9 due to the incident angle of Ni—Co particles to the substrate when the ferromagnetic magnetoresistive element thin film 10 is formed. As a result, the permissible current capacity is lowered, and thus the ferromagnetic magnetoresistive element thin film 10 may be broken down at the constricted portion. However, using the construction having the recess portion 12 of this embodiment, the aluminum wiring metal 9 and the ferromagnetic magnetoresistive element thin film 10 are contacted with each other in the three directions. Therefore, even when variation occurs in the incident angle when the ferromagnetic magnetoresistive element thin film 10 is deposited, there exists at least one direction where no constriction of the ferromagnetic magnetoresistive element thin film 10 occurs as shown in FIG. 10 although there is a constriction direction of the ferromagnetic magnetoresistive element thin film as shown in FIG. 9.

Figure 11:
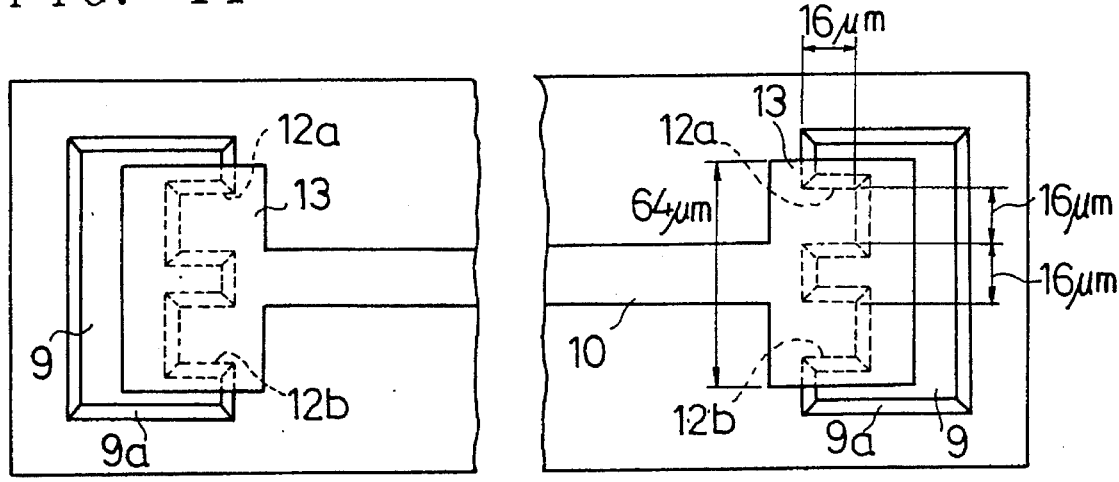
FIGS. 11 and 12 are plane views of the magnetic sensor.
Figure 12:
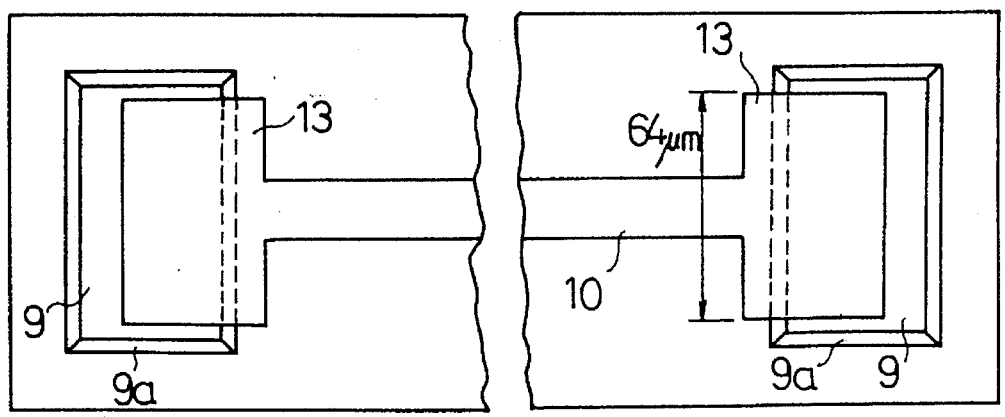

Here, the breakdown rate of the ferromagnetic magnetoresistive element thin film 10 was measured for two cases where two recess portions 12a and 12b are formed as shown in FIG. 11 and where no recess portion is formed as shown in FIG. 12. In FIGS. 11 and 12, the junction between the ferromagnetic magnetoresistive element thin film 10 and the aluminum wiring metal 9 is so designed that a wide portion 13 is formed at the end of the ferromagnetic magnetoresistive element thin film 10 and the length L of the contact portion is made longer to promote the reduction of contact resistance Rc as described above.

Figure 13:
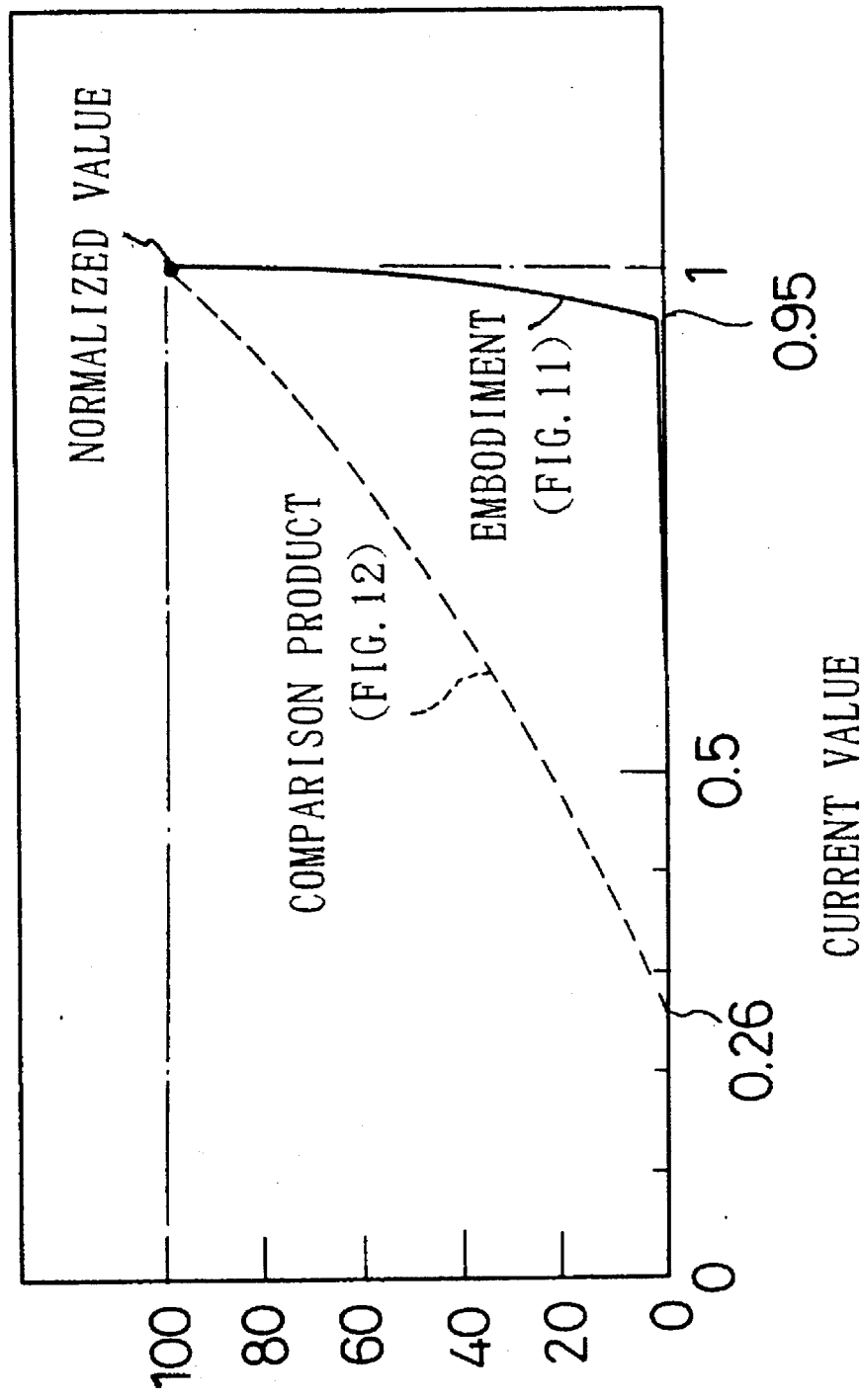
FIG. 13 is a graph showing the relationship between a current value and a film destruction rate in each construction of FIGS. 11 and 12.

The result is shown in FIG. 13, which shows the relationship between a current value and a rate at which the ferromagnetic magnetoresistive element thin film 10 is burnt out at the end portion of the aluminum wiring metal 9 and broken down. The current value is normalized so that the breakdown rate of the structure as shown in FIG. 11 is set to "1". From FIG. 13, it is found out that the breaking current value of the ferromagnetic magnetoresistive element thin film 10 at the end portion of the aluminum wiring metal 9 is increased to three or more times by providing the recess portion. That is, the breaking current value in the case of providing no recess portion was 0.26 while that in the case of providing the two recess portions 12a and 12b was 0.95. That is, the breaking current value can be increased to 0.95/0.26÷3.6 times. As described above, the length L of the contact portion is make longer and in addition the aluminum wiring metal 9 and the ferromagnetic magnetoresistive element thin film 10 are contacted with each other to flow current in such a direction that no constriction exists, whereby the permissible current capacity can be increased.

On the other hand, in a case where the ferromagnetic magnetoresistive element thin film 10 and the aluminum wiring metal 9 are contacted with each other, the slant portion 9a is formed at the tip portion of the aluminum wiring metal 9, and the ohmic junction is formed with the circuit element by the heat treatment (under foaming gas atmosphere). In this process, the surface of the aluminum wiring metal 9 is oxidized, and it serves as a barrier layer when the ohmic junction is formed between the ferromagnetic magnetoresistive element thin film 10 and the aluminum wiring metal 9, so that the equation (1) is not satisfied. In addition, the contact resistance rate ρc is increased to $10^{-4} \Omega cm^2$ to $10^{-5} \Omega cm^2$. However, as described above, the contact resistance rate ρc can be set below $10^{-5} \Omega cm^2$ by etching the oxide layer of the surface of the aluminum wiring metal 9. As a result, the contact resistance can be reduced.

Figure 14:
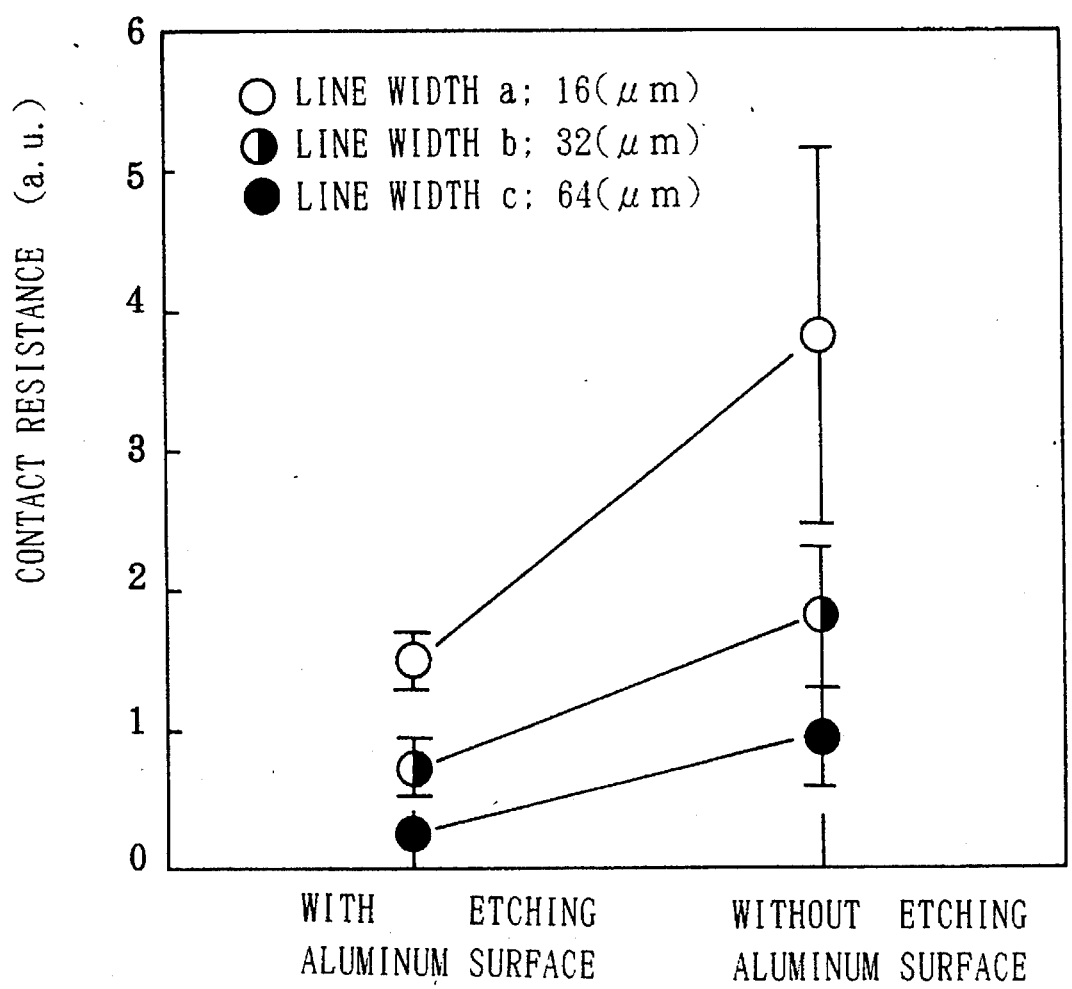
FIG. 14 is a graph showing a measurement result of a contact resistance.

FIG. 14 shows the measurement results of the contact resistance value in a case where the oxide layer of the surface of the aluminum wiring metal 9 is etched and in a case where no etching treatment is conducted on the oxide layer. As shown in the figure, by etching the oxide layer, both the contact resistance and the variation of the resistance value are reduced to ⅓ or less. In addition, the contact resistance rate (ρc) is reduced below $10^{-6} \Omega cm^2$.

Next, the vacuum heat treatment, which is carried out before the surface protection film 11 is formed, will be hereunder described on the basis of various experimental results.

Figure 15:
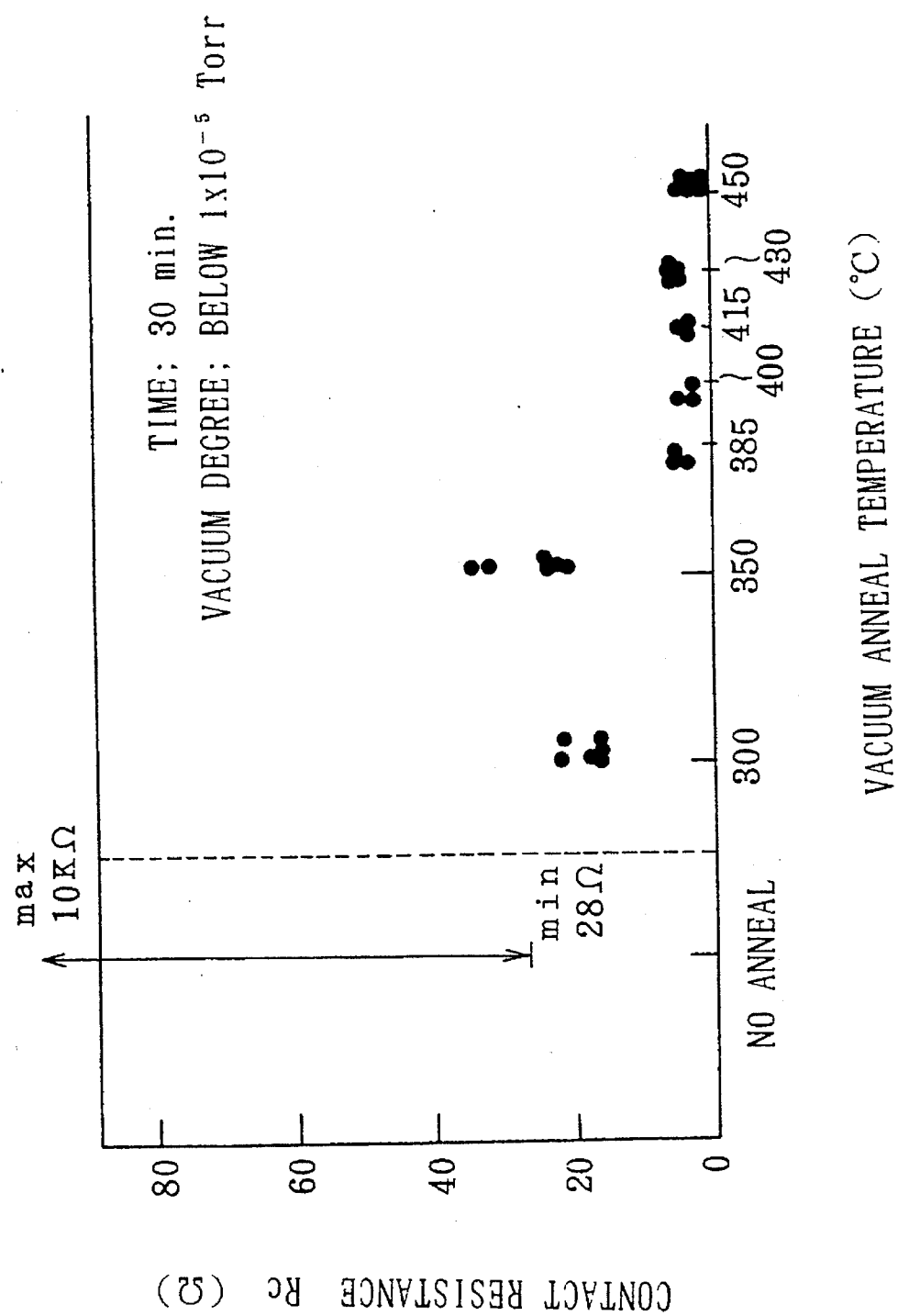
FIG. 15 is a graph showing a measurement result of a contact resistance when temperature in a vacuum heat-treatment is varied.

FIG. 15 show a measurement result of the bond resistance (contact resistance) between the ferromagnetic magnetoresistive element thin film 10 and the aluminum wiring metal when the temperature in the vacuum heat treatment is varied. It is apparent from the figure that in order to suppress the contact resistance to be a small value, the temperature is required to be above 350° C. If the vacuum heat-treatment temperature is above 450° C., aluminum and Ni are excessively reacted with each other, and the surface has intensive unevenness. Therefore, the vacuum heat-treatment temperature is necessary to be 350° C. to 450° C.

Figure 16:
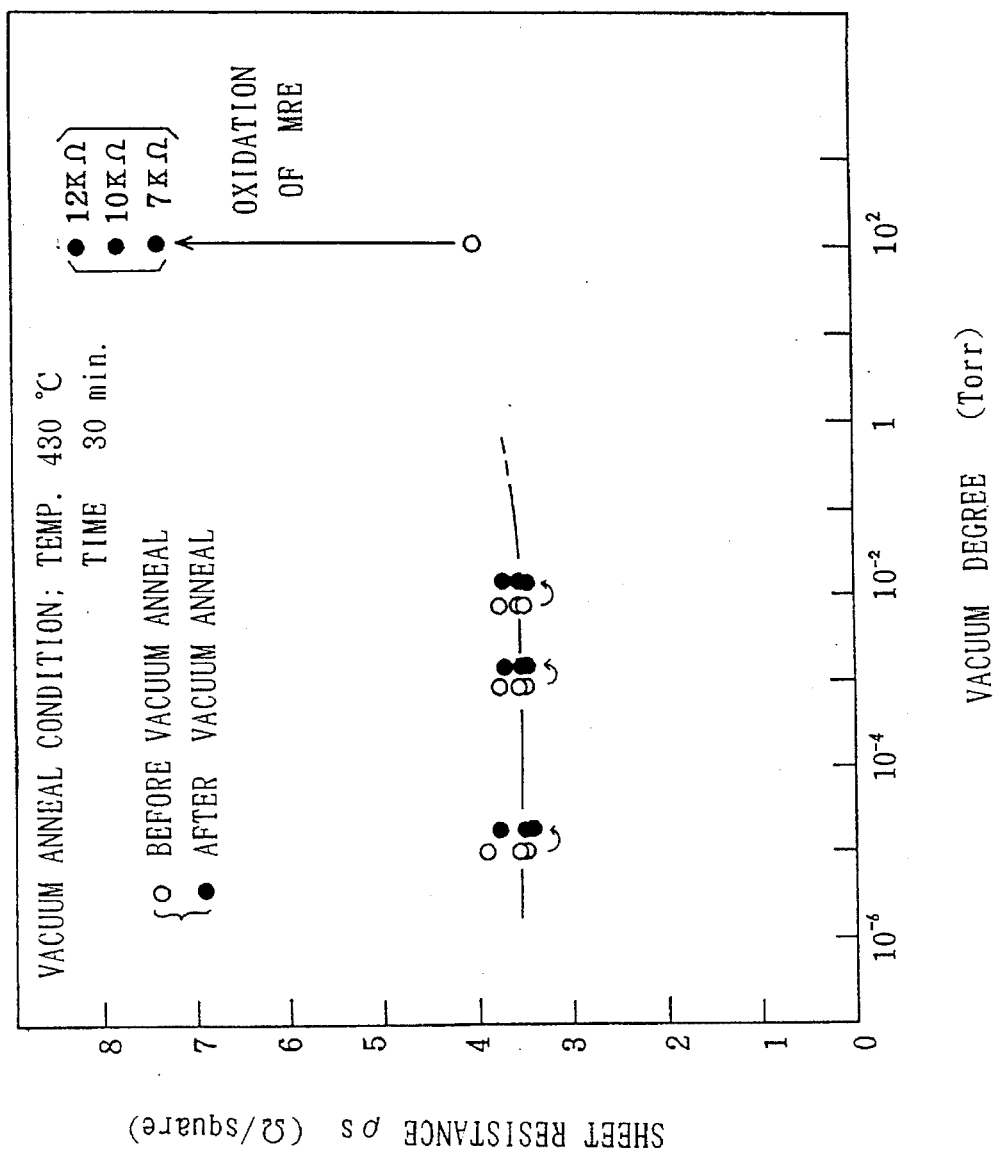
FIG. 16 is a graph showing a measurement result of a sheet resistance when a vacuum degree in the vacuum heat-treatment is varied.

FIG. 16 shows the measurement result of the sheet resistance when the vacuum degree in the vacuum heat treatment is varied. It is apparent from the figure that a vacuum is required to suppress the sheet resistance to a small value. That is, if any gas (oxygen, ammonia, nitrogen, etc.) exists in the environment when the ferromagnetic magnetoresistive element thin film 10 is exposed to high temperature state, the resistance at the bond portion (contact portion) between the aluminum wiring metal 9 and the ferromagnetic magnetoresistive element thin film 10 is increased, and the strongly active ferromagnetic magnetoresistive element thin film 10 is oxidized, so that it can not keep a characteristic as a magnetoresistive member. The vacuum degree may be below about $10^{-2}$ Torr, for example, and in this case no increase in resistance is confirmed.

Figure 17:
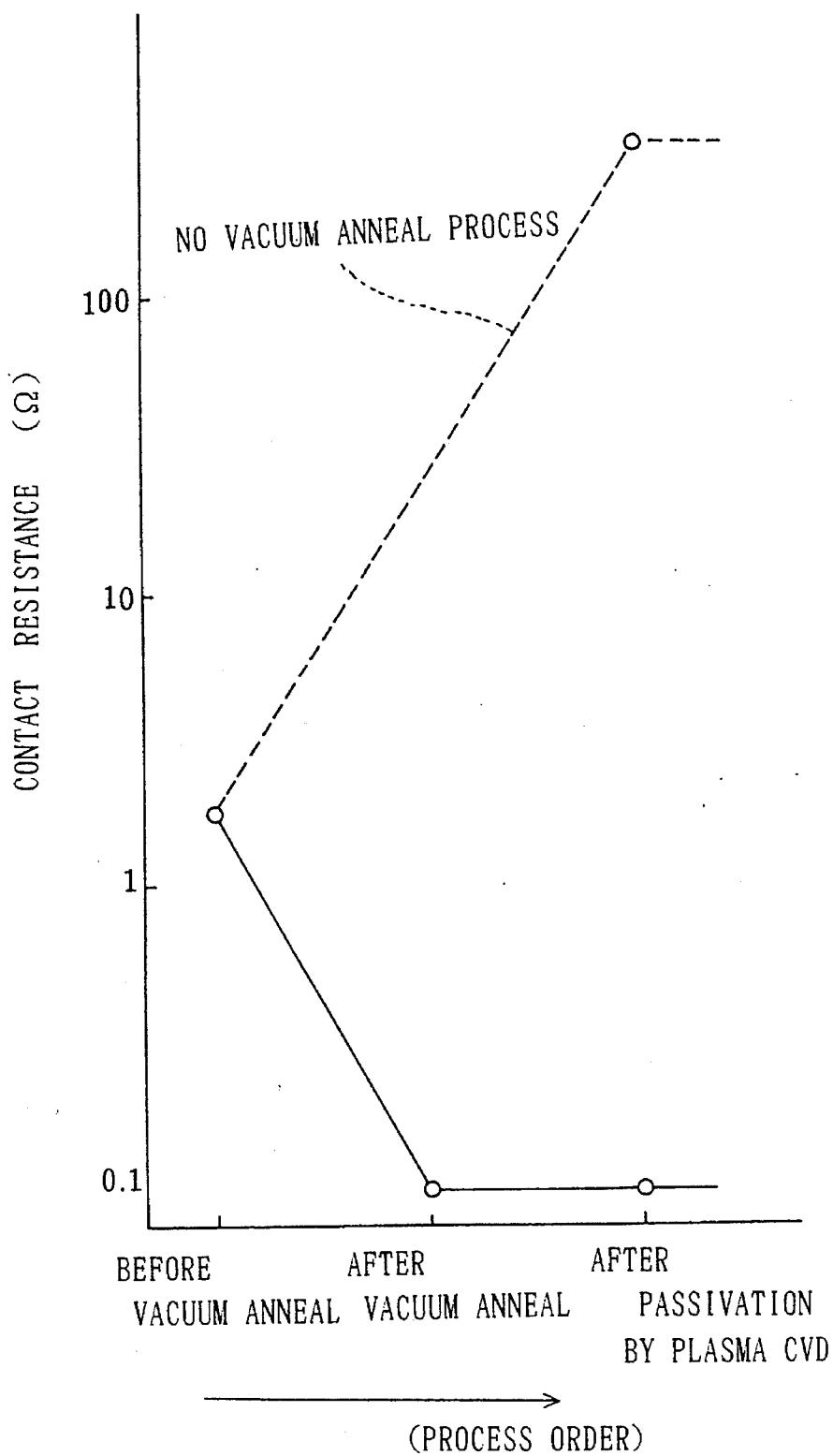
FIG. 17 is a graph showing a contact resistance.

FIG. 17 shows the comparative measurement result of the bond resistance (contact resistance) in a case where the vacuum heat treatment is conducted and in a case where no vacuum heat treatment is conducted. The contact resistance, which is the same after the ferromagnetic magnetoresistive element thin film 10 is formed, is reduced in about one order by conducting the vacuum heat treatment, so that the contact resistance is not varied even when the surface protection film (silicon nitride) 11 is formed by the plasma CVD and the contact resistance is reduced in three or four orders in comparison with the case of conducting no vacuum heat treatment.

Figure 18:
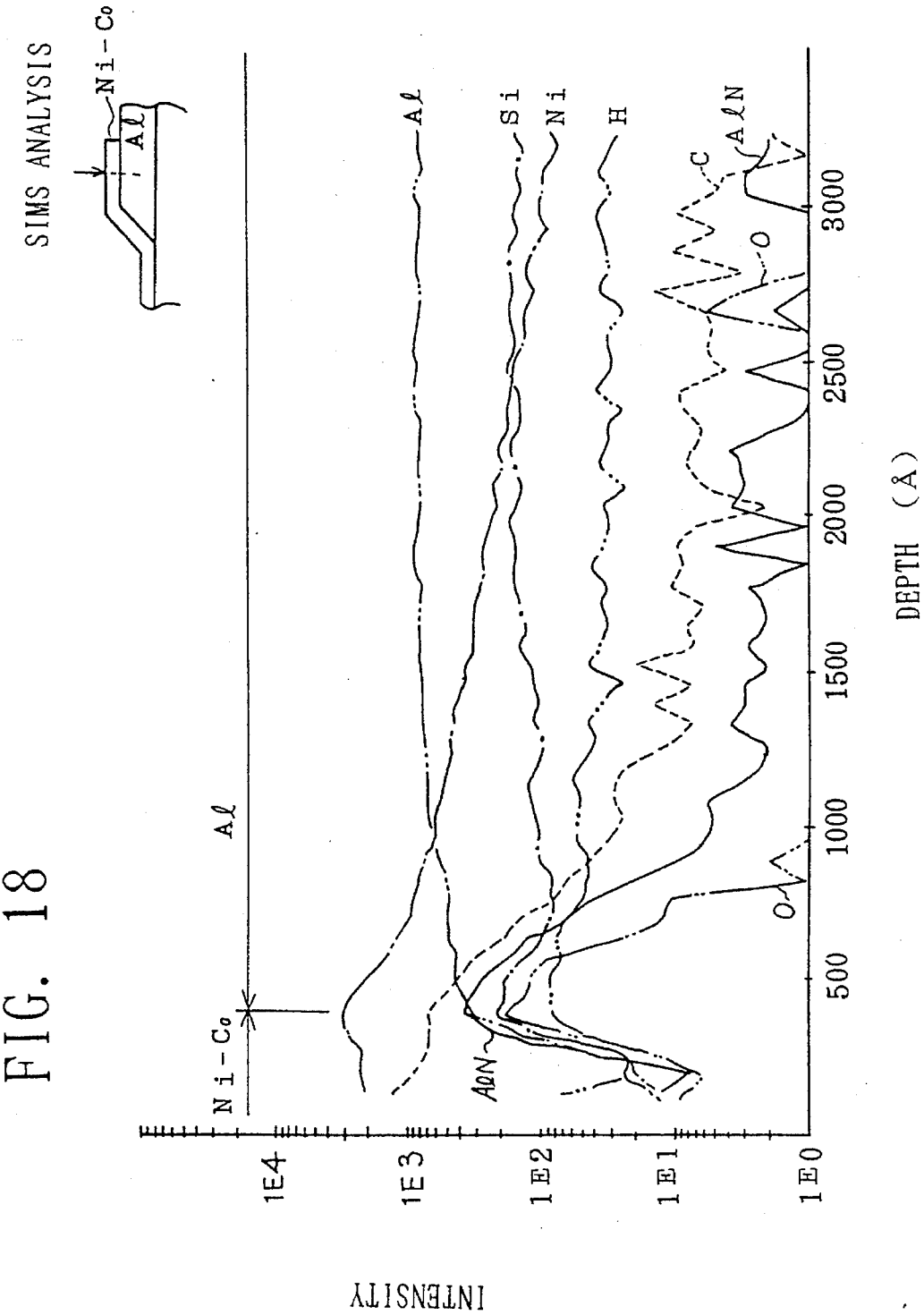
FIG. 18 an SIMS analysis result of the contact portion when the vacuum heat-treatment is conducted.

FIG. 18 shows an analysis result of the bond portion (contact portion) between the aluminum wiring metal 9 and the ferromagnetic magnetoresistive element thin film using a secondary ion mass spectrometer when the vacuum heat treatment is conducted.

Figure 28:
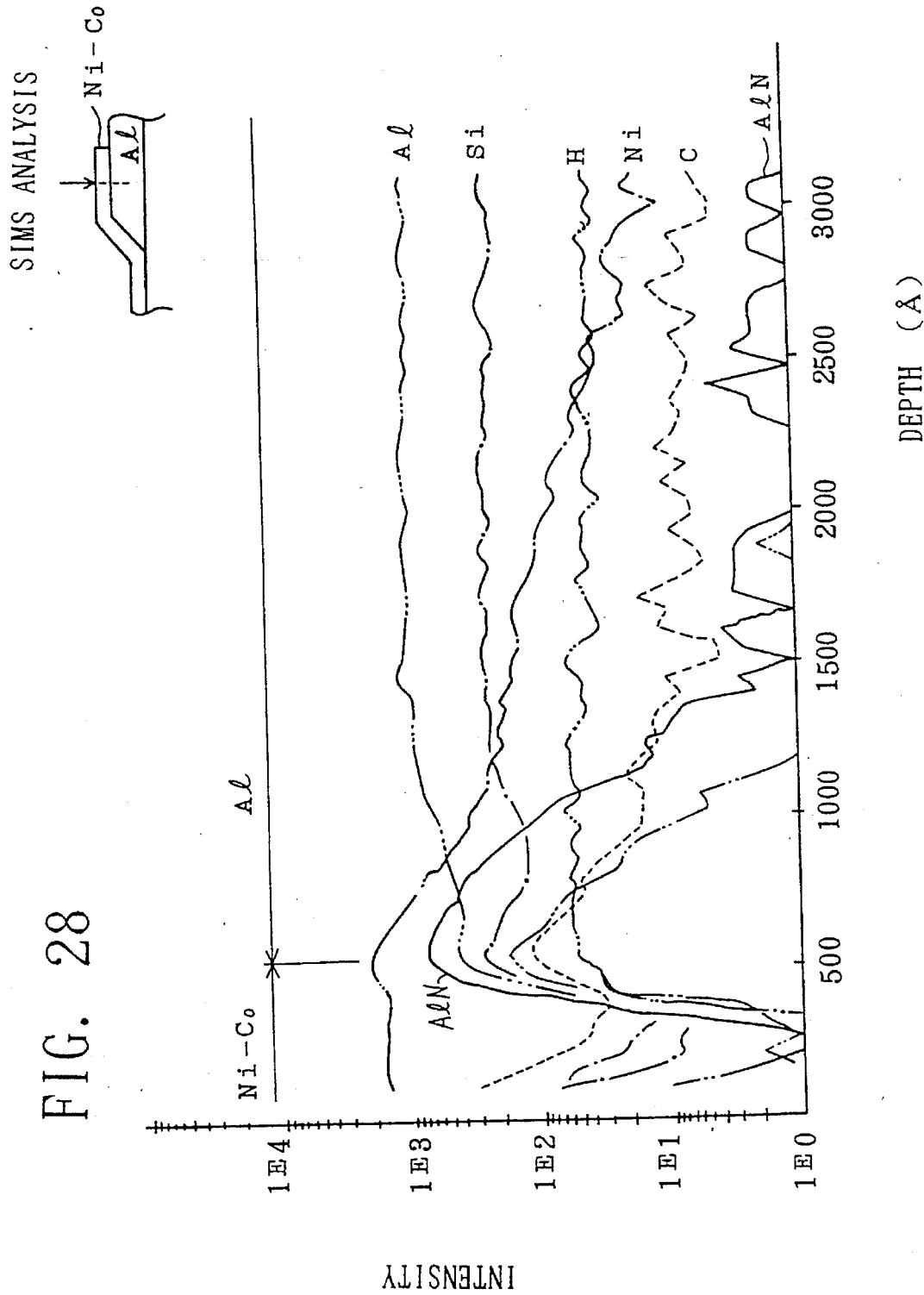
FIG. 28 is a graph showing an SIMS analysis result of the conventional contact portion.
Figure 29:
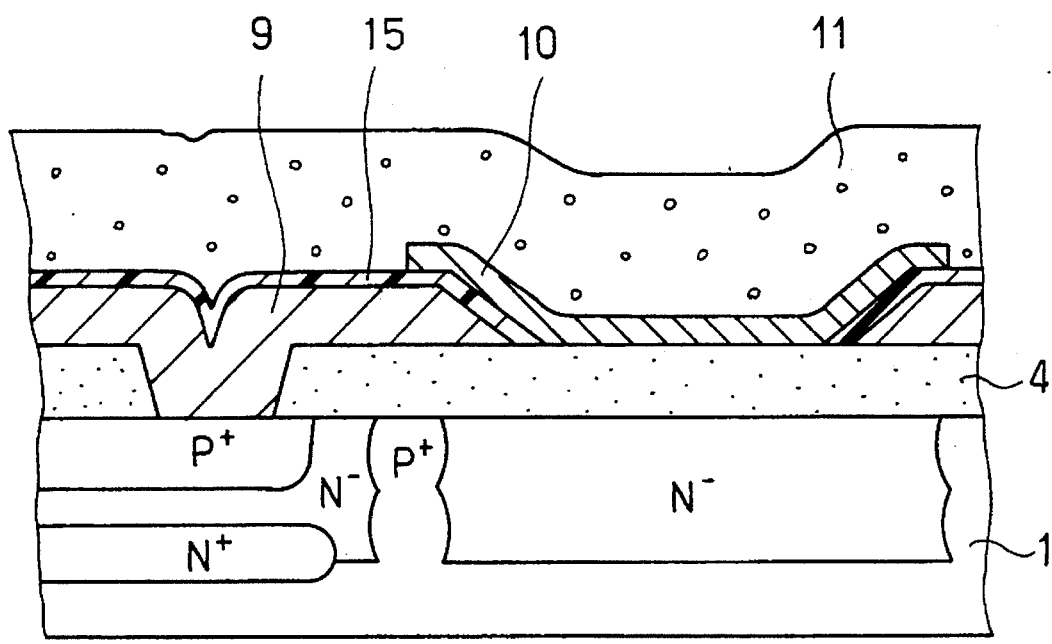
FIG. 29 is a cross-sectional view of the schematic construction of the conventional portion.

In comparison with the conventional result as shown in FIG. 28 when no vacuum heat treatment is conducted, in the conventional result, a large amount of aluminum nitride (AlN) exists at the contact portion, and it causes increase in contact resistance. On the other hand, as shown in FIG. 18, the vacuum heat treatment suppresses the formation of the aluminum nitride to be half or less at the contact portion. This mechanism will be hereunder described.

Figure 19:
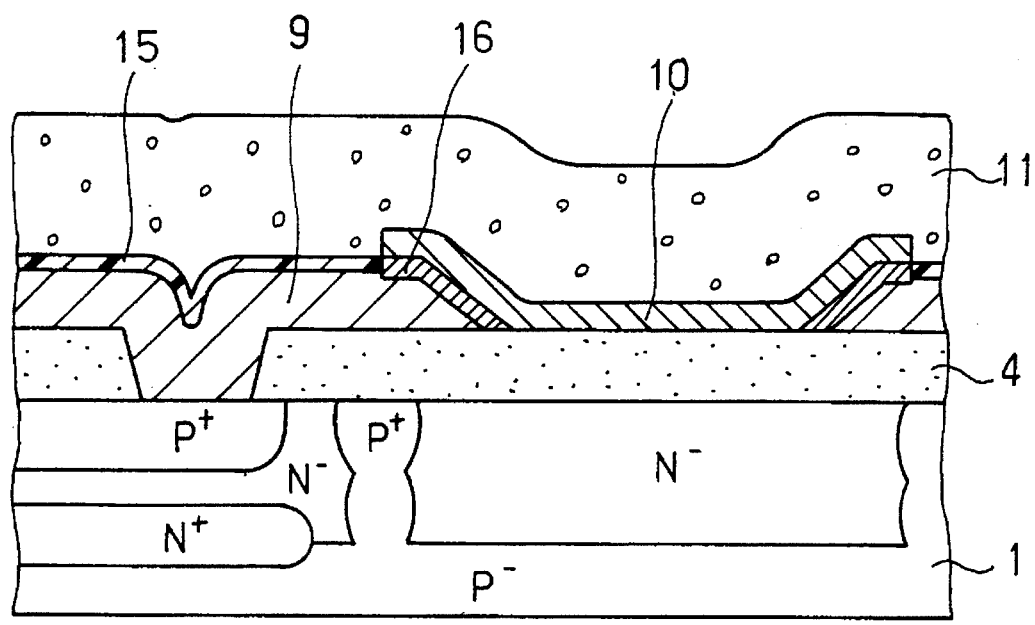
FIG. 19 is a cross-sectional view of the schematic construction of the contact portion when the vacuum heat-treatment is conducted.

By conducting the vacuum heat treatment before the surface protection film (silicon nitride) 11 is formed by the plasma CVD, an alloy layer 16 of the aluminum wiring metal 9 and the ferromagnetic magnetoresistive thin film 10 is formed at the connection portion between the aluminum wiring metal 9 and the ferromagnetic magnetoresistive element thin film 10 as shown in a schematic diagram of FIG. 19. This alloy layer 16 serves to prohibit penetration of nitrogen component of gas reaching the surface of the aluminum wiring metal 9 through the ferromagnetic magnetoresistive element thin film 10 when the surface protection film is formed by the plasma CVD. Accordingly, the insulating aluminum nitride is inhibited from being formed at the connection portion between the ferromagnetic magnetoresistive element thin film 10 and the aluminum wiring metal 9 when the surface protection film is formed. As a result, the increase of the contact resistance can be prevented.

Figure 20:
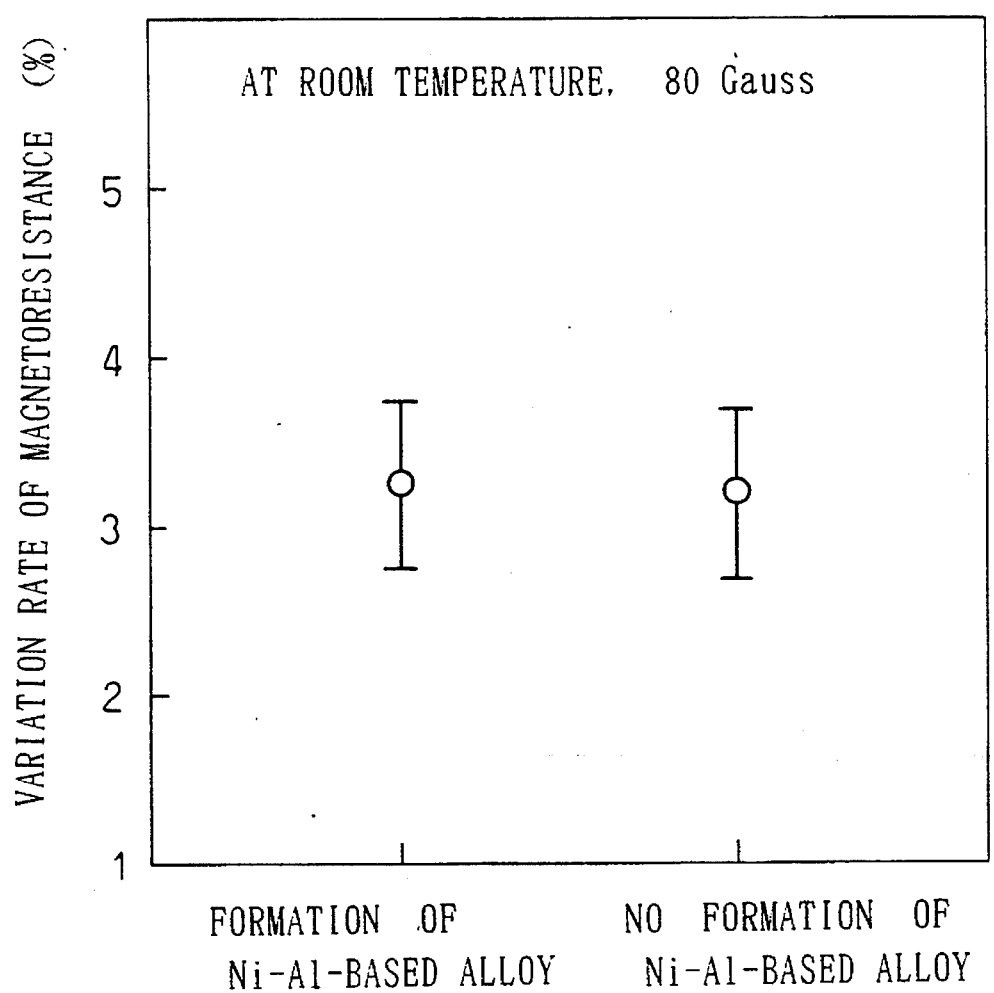
FIG. 20 is a graph showing the relationship between presence of Ni-Al-based alloy and variation rate of magnetic resistance.

Even when the N—Al-based alloy 16 is formed by conducting the vacuum heat treatment, the junction between the aluminum wiring metal 9 and the ferromagnetic magnetoresistive thin film 10 is a metal contact, and thus the equation (1) is also satisfied, so that the resistance variation rate which is a magnetic characteristic of the ferromagnetic magnetoresistive element thin film 10 is unvaried as shown in FIG. 20.

As described above, in this embodiment, the aluminum wiring metal 9 having the slant section is disposed on the P-type semiconductor substrate 1, and in the magnetoresistive element having the Nickel-based ferromagnetic magnetoresistive element thin film 10 extending form the upper side of the slant sectional portion 9a, representing the contact resistance rate of the aluminum wiring metal 9 and the ferromagnetic magnetoresistive element thin film 10 by ρc, the inclination angle of the slant sectional portion 9a of the aluminum wiring metal 9 by θ, and the thickness of thinner one of the aluminum wiring metal 9 and the ferromagnetic magnetoresistive element thin film 10 at the contact portion therebetween by t and the length of the contact portion by L, the contact resistance Rc between the aluminum wiring metal 9 and the ferromagnetic magnetoresistive element thin film 10 is determined so that the following equation is satisfied: $Rc = \rho c \cdot \sin\theta / (t \cdot L)$ Therefore, the contact resistance Rc between the aluminum wiring metal 9 and the ferromagnetic magnetoresistive element thin film 10 can be accurately determined.

Further, the film formation is made using the vacuum deposition method when the ferromagnetic magnetoresistive element thin film 10 is disposed on the aluminum wiring metal 9, and the aluminum wiring metal 9 and the ferromagnetic magnetoresistive element thin film 10 are disposed so as to be contacted with each other in two or more directions at the formation time of the recess portion 12 as shown in FIG. 3, so that even when variation occurs in the incident angle at the deposition time of the ferromagnetic magnetoresistive element thin film 10, there exists at least one direction that no constriction occurs in the ferromagnetic magnetoresistive element thin film 10. That is, as the linear confronting line length between the aluminum wiring metal 9 and the ferromagnetic magnetoresistive element thin film 10 is made longer, the contact area is larger. Further, if the incident angle is controlled at the deposition time of Ni—Co, it must be set at the optimum position of a holder in the vacuum deposition device. However, in this embodiment, such a disadvantage is avoided, and the aluminum wiring metal 9 and the ferromagnetic magnetoresistive element thin film 10 can be contacted with each other more easily and more accurately.

Further, in the case where the Ni—Co-based ferromagnetic magnetoresistive element thin film 10 is used as the magnetic sensor, the value of L is increased to reduce the value of Rc, so that the offset voltage occurring due to variation of the resistance value between bridges can be greatly reduced to ⅓ to ½. Further, in a case where this magnetic sensor is used for on-vehicle mount, if the contact resistance of Ni—Co/Al is large when a battery voltage is directly applied to the ferromagnetic magnetoresistive element thin film 10, this portion may be burnt out. However, in this embodiment, the contact resistance can be set to a design value, so that such a disadvantage can be avoided.

In the case where the ferromagnetic magnetoresistive element thin film 10 is directly laminated by an electron beam deposition method after the Al sinter process (heat treatment process), the oxide layer on the surface of the aluminum wiring metal 9 which is formed in the aluminum sinter process remains at it is. However, in this embodiment, the oxide layer on the surface of the aluminum wiring metal 9 is first etched by the plasma etching treatment of inert gas (for example, Ar gas), and then the ferromagnetic magnetoresistive element thin film 10 is subjected to the electron beam deposition with keeping vacuum, so that the metal junction having no oxide layer is formed at the interface between the ferromagnetic magnetoresistive element thin film 10 and the aluminum wiring metal 9.

Still further, in the case where the ferromagnetic magnetoresistive element thin film 10 is formed on the aluminum wiring metal 9 to electrically connect the aluminum wiring metal 9 to the ferromagnetic magnetoresistive element thin film 10, and then the ferromagnetic magnetoresistive element thin film 10 is covered with the surface protection film 11 formed of silicon nitride by the plasma CVD method, the vacuum heat treatment at 350° to 450° C. is conducted before the surface protection film 11 is formed. Therefore, at the connection portion between the aluminum wiring metal 9 and the ferromagnetic magnetoresistive element thin film 10 is formed the alloy layer 16 of the aluminum wiring metal 9 and the ferromagnetic magnetoresistive element thin film 10 in the vacuum heat treatment, and the formation of the insulating aluminum nitride at the connection portion when the plasma CVD is conducted is inhibited by the gas containing nitrogen. As a result, the increase of the contact resistance between the ferromagnetic magnetoresistive element thin film 10 and the aluminum wiring metal 9 due to the formation of the surface protection film 11 can be inhibited.

This invention is not limited to the above embodiment. For example, in the above embodiment, the ferromagnetic magnetoresistive element thin film 10 is thinner than the aluminum wiring metal 9, and thus "t" of the equation (1) is the thickness of the ferromagnetic magnetoresistive element thin film 10. However, when the aluminum wiring metal 9 is thinner than the ferromagnetic magnetoresistive element thin film 10, the thickness of the aluminum wiring metal 9 is "t" of the equation (1).

Figure 21:
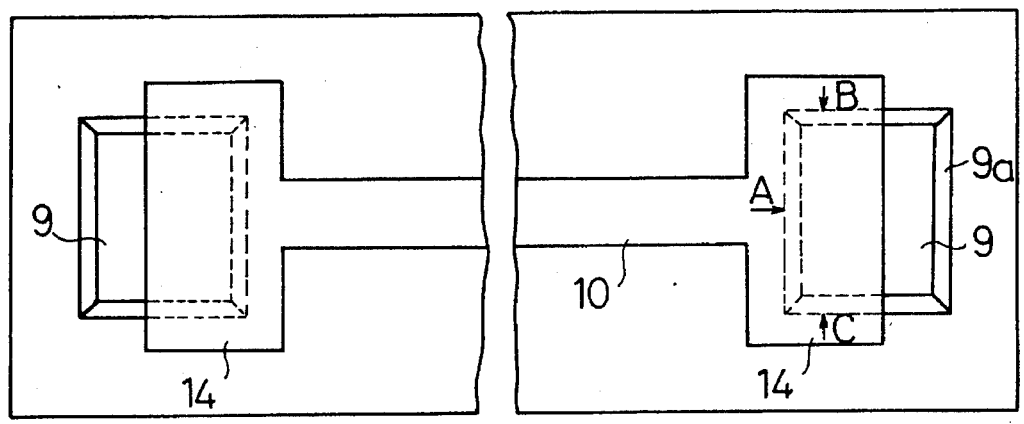
FIGS. 21 and 22 are plane views of a magnetic sensor which is an application example of the first embodiment.
Figure 22:
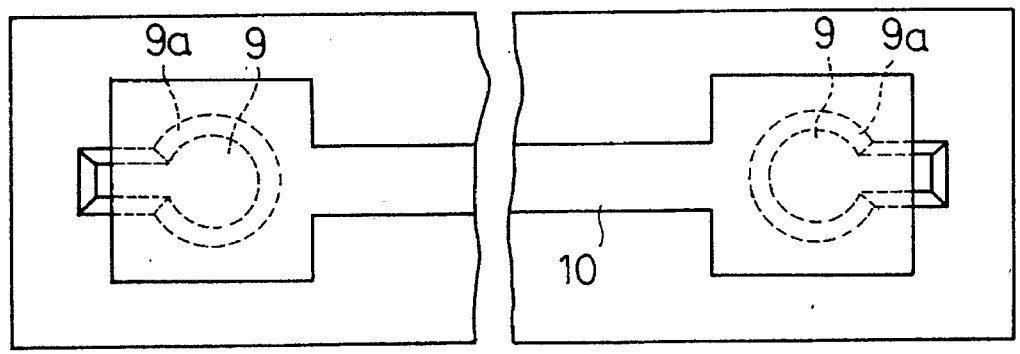

Further, in order to contact the aluminum wiring metal 9 with the ferromagnetic magnetoresistive element thin film 10 in at least three directions, as another manner as shown in FIG. 21, the ferromagnetic magnetoresistive element thin film 10 may be covered around the square or rectangular aluminum wiring metal 9. That is, the contact with the side surface portion of the aluminum wiring metal 9 may be made at the broad portion 14 of the tip side of the ferromagnetic magnetoresistive element thin film 10 to contact the aluminum wiring metal 9 with the ferromagnetic magnetoresistive element thin film 10 in the three directions, and the length L of the contact portion may be longer. In this structure, the aluminum wiring metal 9 and the ferromagnetic magnetoresistive element thin film 10 are disposed so as to be contacted with each other in the three directions. Further, as shown in FIG. 22, the ferromagnetic magnetoresistive element thin film 10 may be covered around a circular aluminum wiring metal 9. In this structure, the aluminum wiring metal 9 and the ferromagnetic magnetoresistive element thin film 10 can be contacted with each other in substantially all directions.

Figure 23:
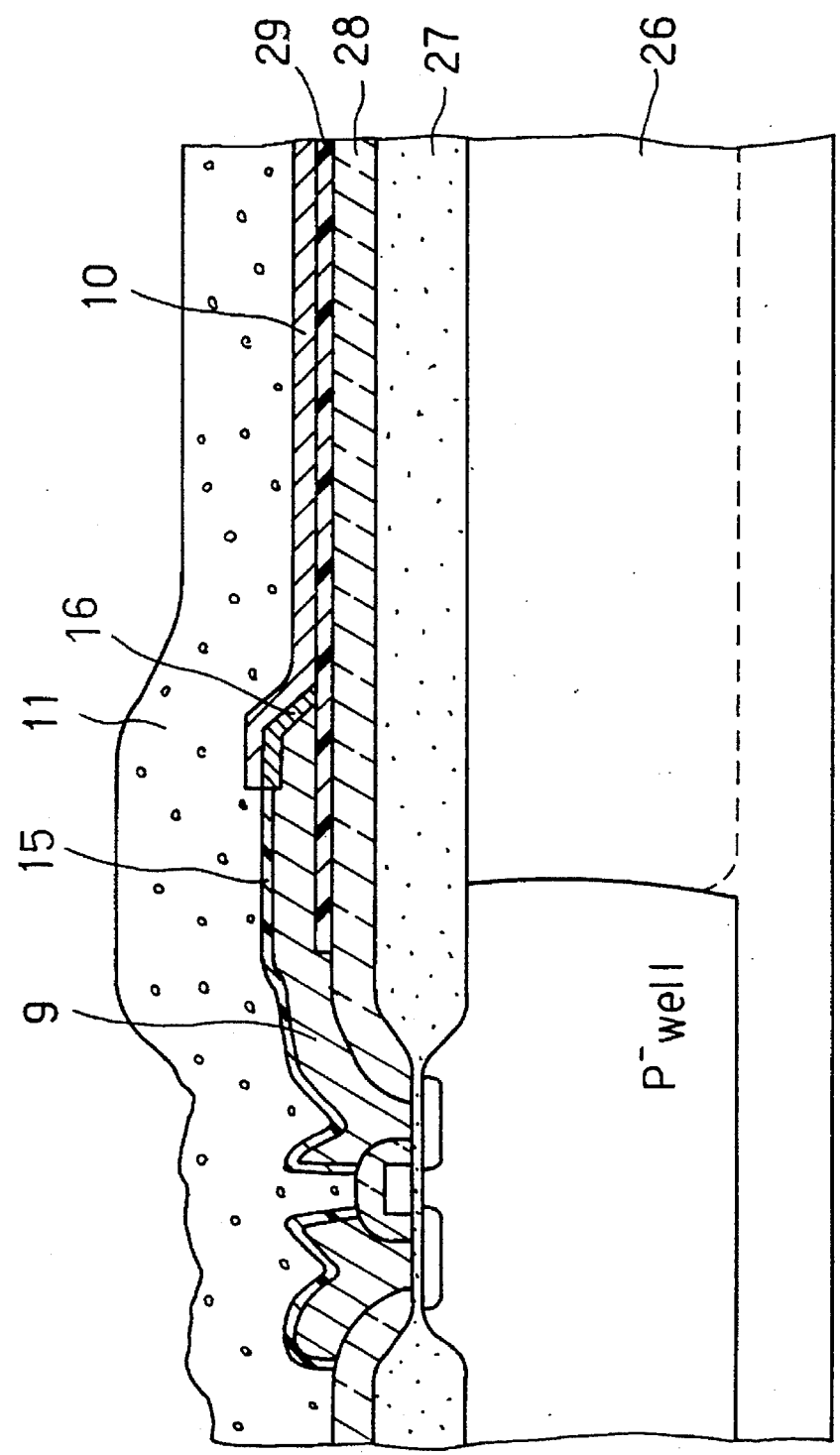
FIGS. 23 and 24 are cross-sectional views of another example of the magnetic sensor of the first embodiment.

Further, in the above embodiment, the case where the bipolar IC is formed on the semiconductor substrate 1 is described. However, it may be integrated with a MOS element. FIG. 23 shows a structure that this invention is implemented on the C-MOS transistor. That is, a BPSG film 28 is formed at the main surface side of the C-MOS structure silicon substrate 26 through a LOCOS oxide film 27, and the plasma silicon nitride film 29 is formed on the BPSG film 28. The ferromagnetic magnetoresistive thin film 10 of Ni—Co and the aluminum wiring metal 9 are connected to each other through the Ni—Al-based alloy 16 as described above on the plasma silicon nitride film 29, and covered with the surface protection film 11 formed of plasma silicon nitride film.

Further, the vacuum heat treatment is conducted in the above embodiment, however, the heat treatment may be conducted under atmosphere of another inert gas (helium, argon or the like) containing no $N_2$.

Figure 24:
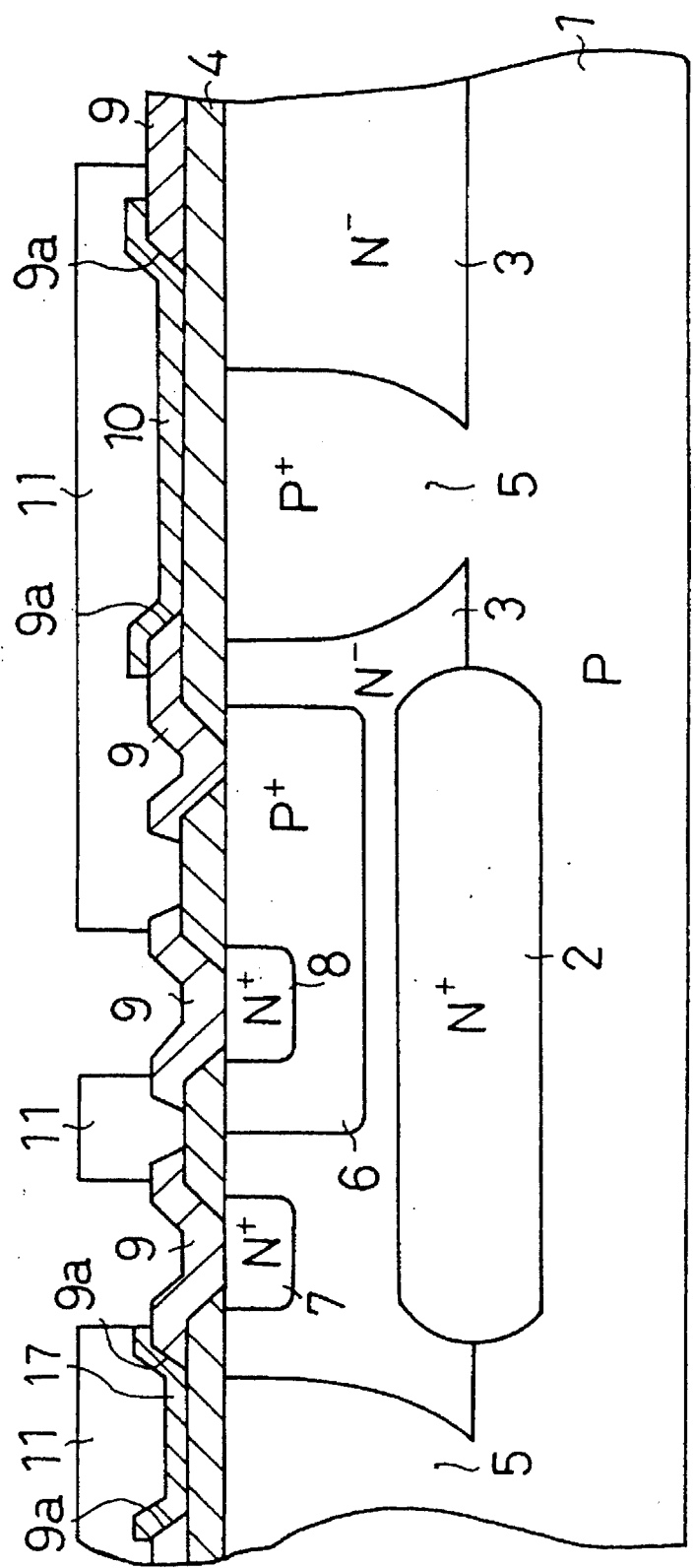
Figure 25:
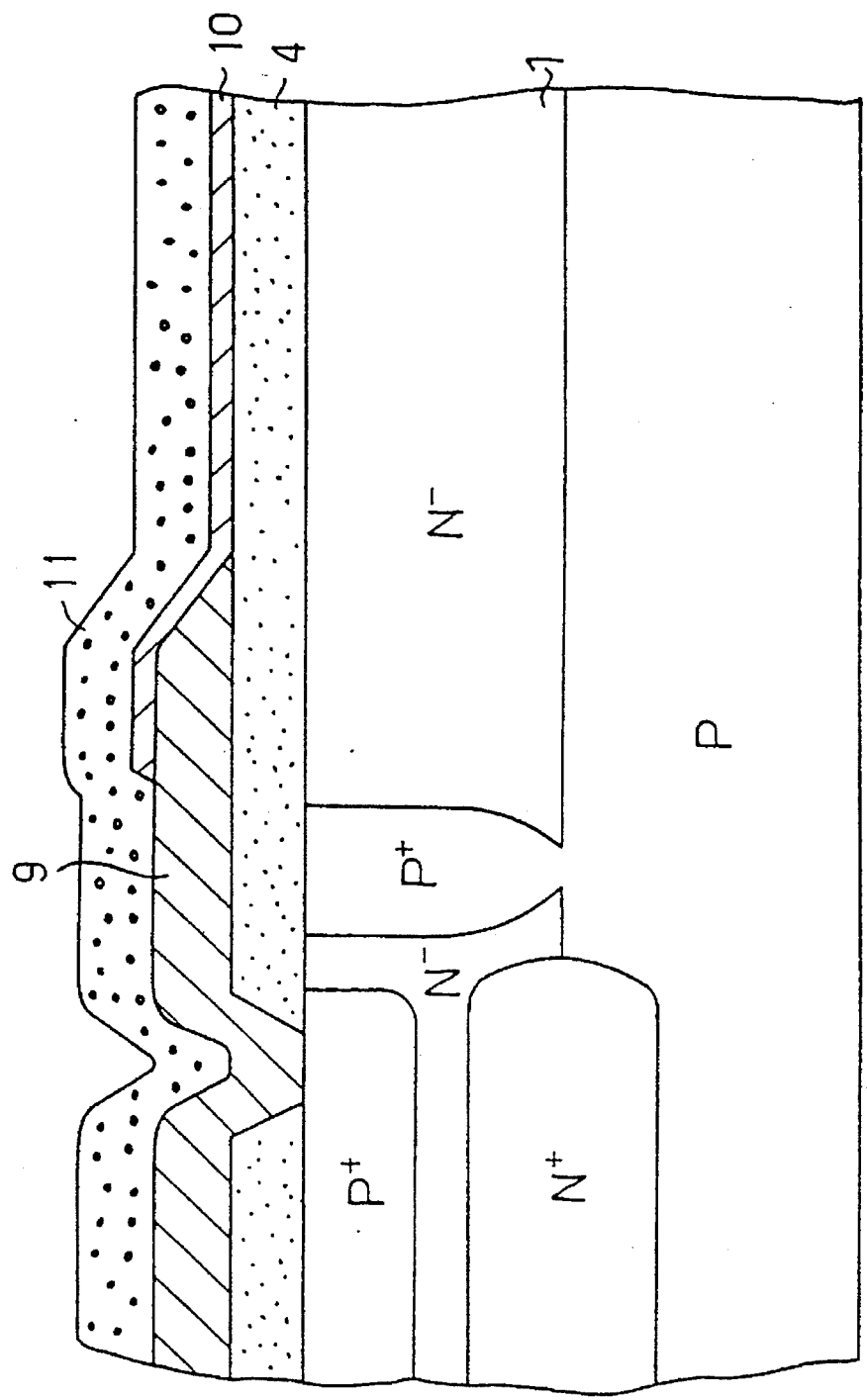
FIG. 25 is a cross-sectional view of the prior art.
Figure 26:
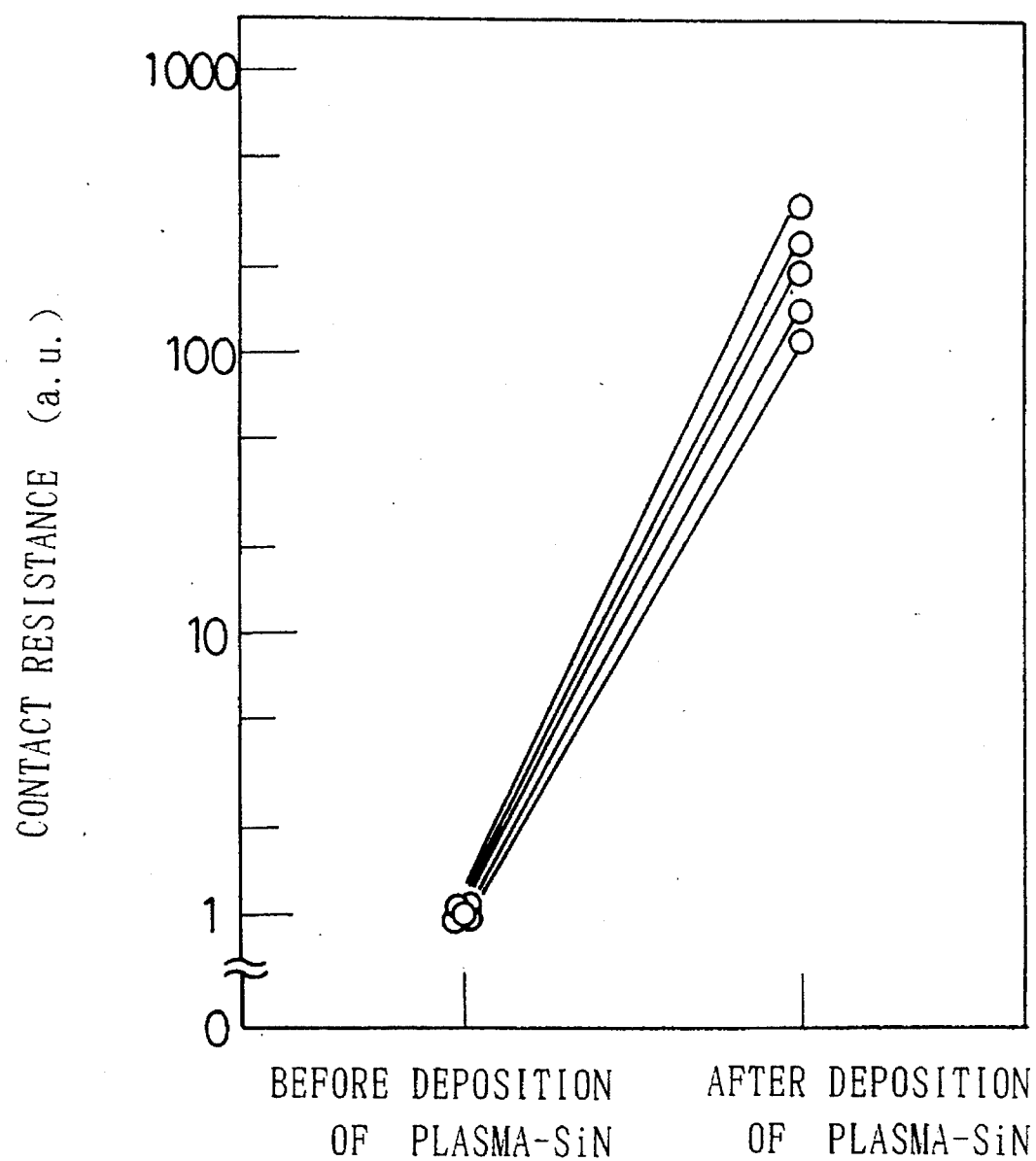
FIGS. 26 and 27 are graphs showing measurement results of the contact resistance.
Figure 27:
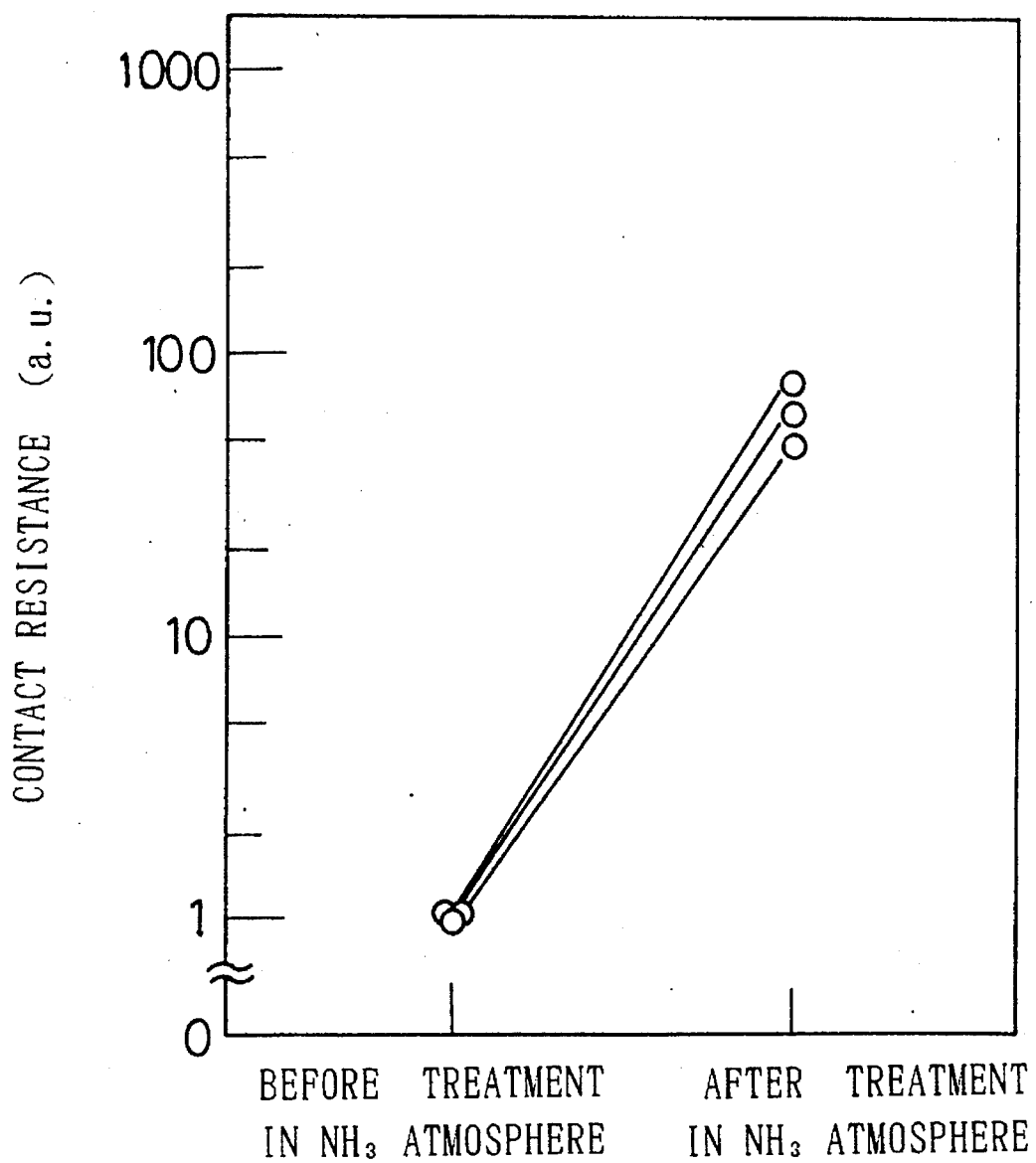

As shown in FIG. 24, in the magnetic sensor having the ferromagnetic magnetoresistive element thin film 10 (Ni—Co thin film), this invention may be applied to a case where a protection resistance member 17 composed of the same material as the ferromagnetic magnetoresistive element thin film 10 is used to protect a surge voltage, etc. for the ferromagnetic magnetoresistive element thin film 10. That is, in the magnetic sensor in which the aluminum wiring metal 9 whose end portion is formed in a slant shape in section on the P-type semiconductor substrate 1 and the protection resistance member 17 composed of the same material as the ferromagnetic magnetoresistive element thin film 10 is formed so as to extend from the upper side of the sectional slant portion 9a, the contact resistance Rc may be determined from the equation (1).

Next, another embodiment will be described. In the following embodiment, an AlN insulating layer 15 which will be formed on the Al surface when the surface protection film 11 is omitted from the illustration.

(Second Embodiment)

Figure 30:
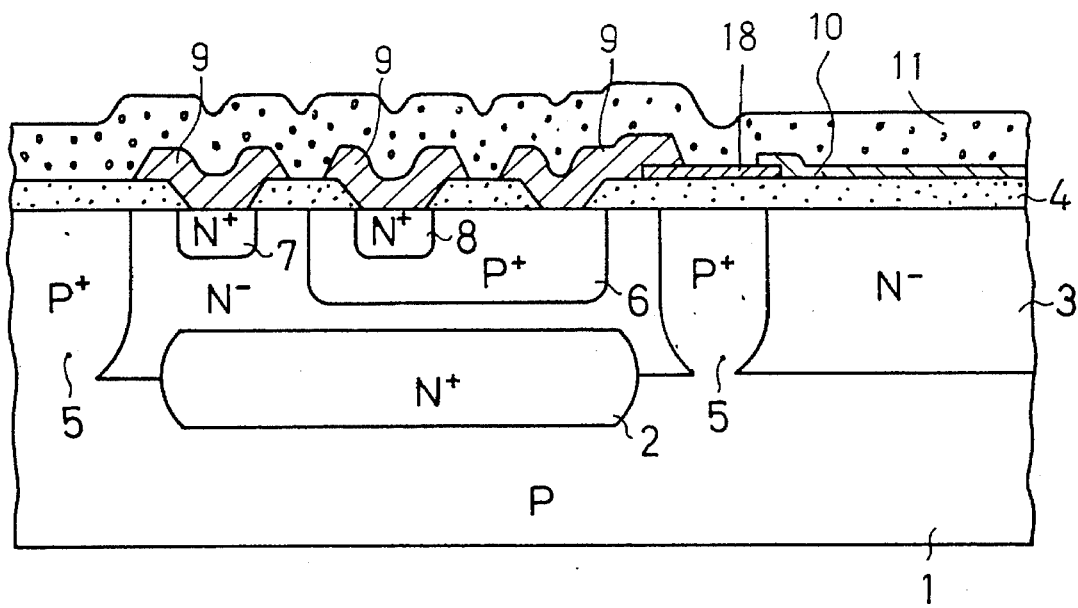
FIG. 30 is a cross-sectional view of a magnetic sensor of a second embodiment.

FIG. 30 is a cross-sectional view of the magnetic sensor of the second embodiment according to this invention, and the ferromagnetic magnetoresistive element thin film 10 and the signal processing circuit are integrated in the same substrate.

The second embodiment of this invention will be described in accordance with its manufacturing process with reference to FIGS. 31 to 33. The same elements as the first embodiment are represented by the same reference numerals.

Figure 31:
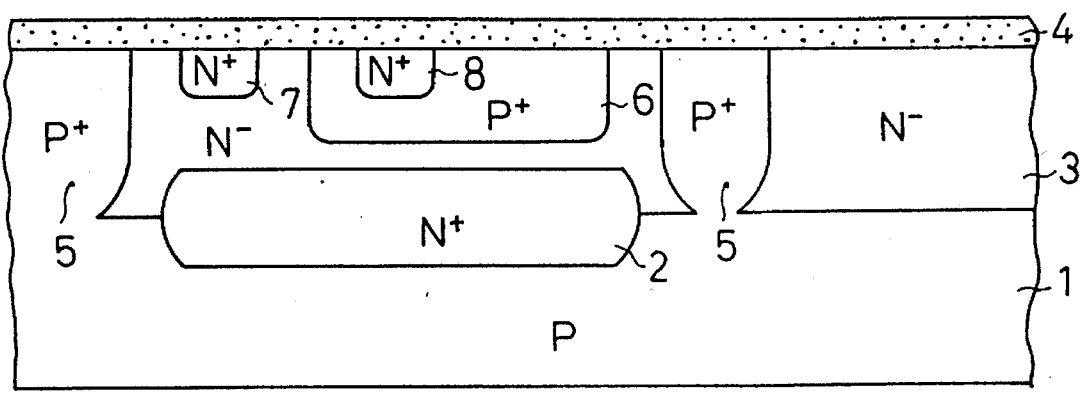
FIGS. 31 to 33 are cross-sectional views showing a manufacturing process of the magnetic sensor of the second embodiment.

First, as shown in FIG.31, like the first embodiment, on the main surface of the P-type semiconductor substrate 1 is formed a vertical NPN bipolar transistor comprising an N+-type buried layer 2, an N−-type epitaxial layer 3, an P+-type diffusion region 6 and N+-type diffusion regions 7 and 8. This transistor serves to amplify a signal from a ferromagnetic magnetoresistive element thin film 11 as described later.

Figure 32:
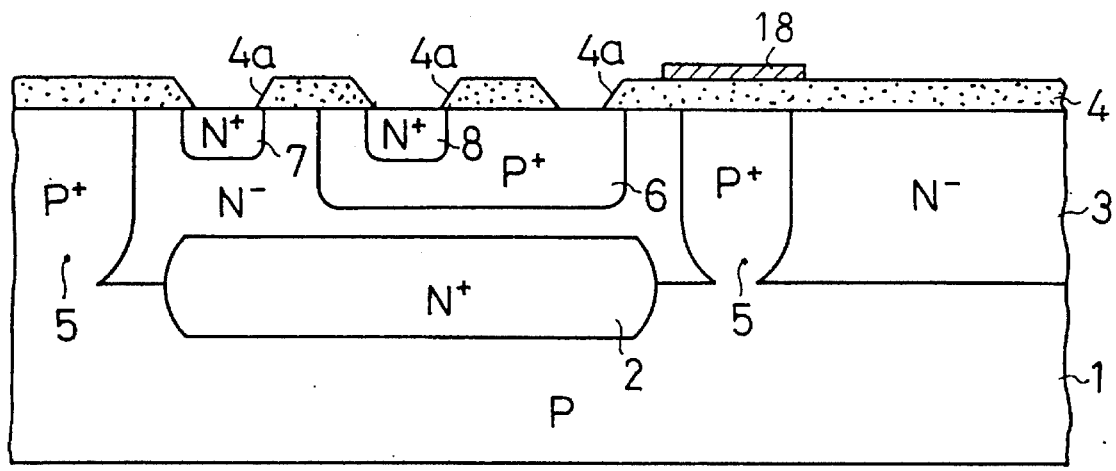
Figure 33:
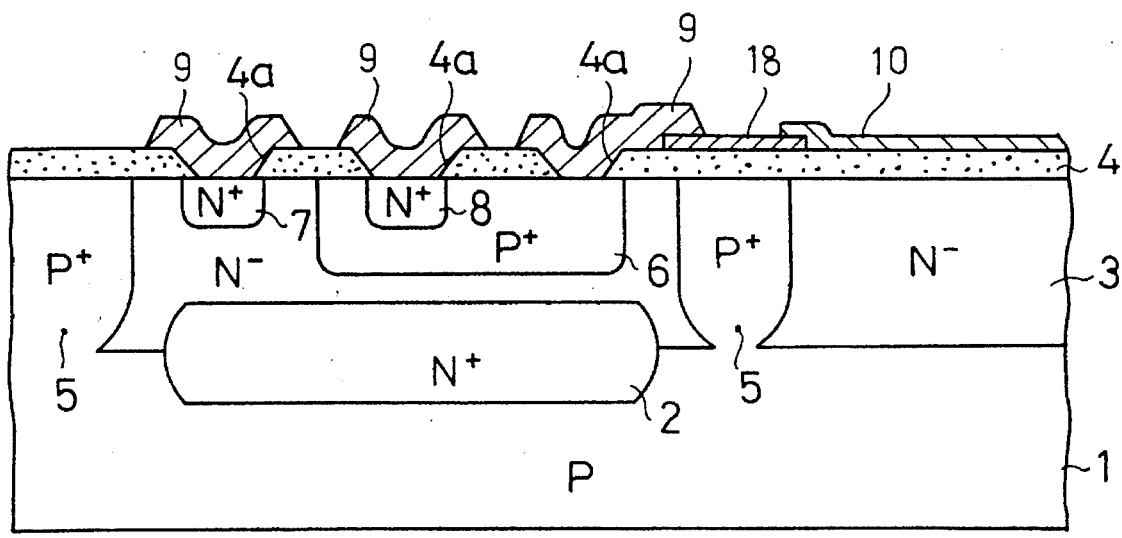

Subsequently, as shown in FIG. 1 32, conductive metal 18 of non-aluminum group conductor which is formed of TiW is deposited on a silicon oxide film 4 by a sputtering method. The film thickness is set to about 10 nm to 30 nm. This conductive metal 18 is patterned by a photoetching treatment, Thereafter, an opening portion 4a is selectively formed in the silicon oxide film 4 using the photolithography to form a contact portion. Subsequently, as shown in FIG. 33, thin film aluminum wiring metal 9 is deposited on the main surface of the P-type semiconductor substrate 1 in about 0.1 μm, and this aluminum wiring metal 9 is patterned by the photoetching treatment. At this time, the aluminum wiring metal 9 is disposed so that tile end portion thereof is overlapped with the upper surface of the end portion of the conductive metal 18. Subsequently, an ohmic contact between the aluminum wiring metal 9 and the circuit element (silicon) is formed by the heat treatment process (an alloying treatment is conducted).

Subsequently, the above substrate is set on the substrate holder in the electron beam deposition apparatus. Similarly in the First embodiment, the ferromagnetic magnetoresistive element thin film 10 is deposited in about 0.5 nm thickness by the electron beam deposition method and then patterned by the photoetching treatment. At this time, the ferromagnetic magnetoresistive element thin film 10 is so disposed that the end portion thereof is overlapped with the upper surface of the end portion of the conductive metal 18. The ferromagnetic magnetoresistive element thin film 10 and the aluminum wiring metal 9 are electrically connected to each other through the conductive metal 18.

Finally, as shown in FIG. 30, the surface protection film 11 formed of plasma silicon nitride film is formed using the plasma CVD apparatus. At the film formation time of this plasma silicon nitride film, it is exposed to $NH_3$ gas which is one of atmosphere gases, however, no nitride layer is formed on the surface of the conductive metal 18 formed of TiW. Further, since at the connection portion with the aluminum wiring metal 9 the conductive metal 18 serves as a lower layer and thus the contact is made at the aluminum lower portion, no insulating Al—N is formed at the contact portion. The conductive metal 18, the aluminum wiring metal 9, the ferromagnetic magnetoresistive element thin film 10 and the circuit element formed on the main surface of the P-type semiconductor substrate 1 are protected from the outside air by the surface protection film 11.

As described above, in this embodiment, the ferromagnetic magnetoresistive element thin film 10 formed of Ni—Co, the conductive metal 18 (non-aluminum group conductor) formed of TiW and the aluminum wiring metal 9 are disposed on the P-type semiconductor substrate 1 to electrically connect the ferromagnetic magnetoresistive element thin film 10 and the aluminum wiring metal 9 with each other through the conductive metal 18, and further the ferromagnetic magnetoresistive element thin film 10, the conductive metal 18 and the aluminum wiring metal 9 are covered with the surface protection film formed of plasma silicon nitride film 11. Accordingly, the nitride layer is formed on the surface of the aluminum wiring metal 9 under $NH_3$ gas atmosphere when the surface protection film 11 is formed. However, no insulating AlN exists at the contact portion between the ferromagnetic magnetoresistive element thin film 10 and the conductive metal 18 and the contact portion between the conductive metal 18 and the aluminum wiring metal 9. That is, the ferromagnetic magnetoresistive element thin film 10 and the aluminum wiring metal 9 are electrically connected to each other through the conductive metal 18 (TiW) which does not form nitride, whereby the increase in contact resistance of Ni—Co/Al due to formation of the surface protection film can be inhibited.

Figure 34:
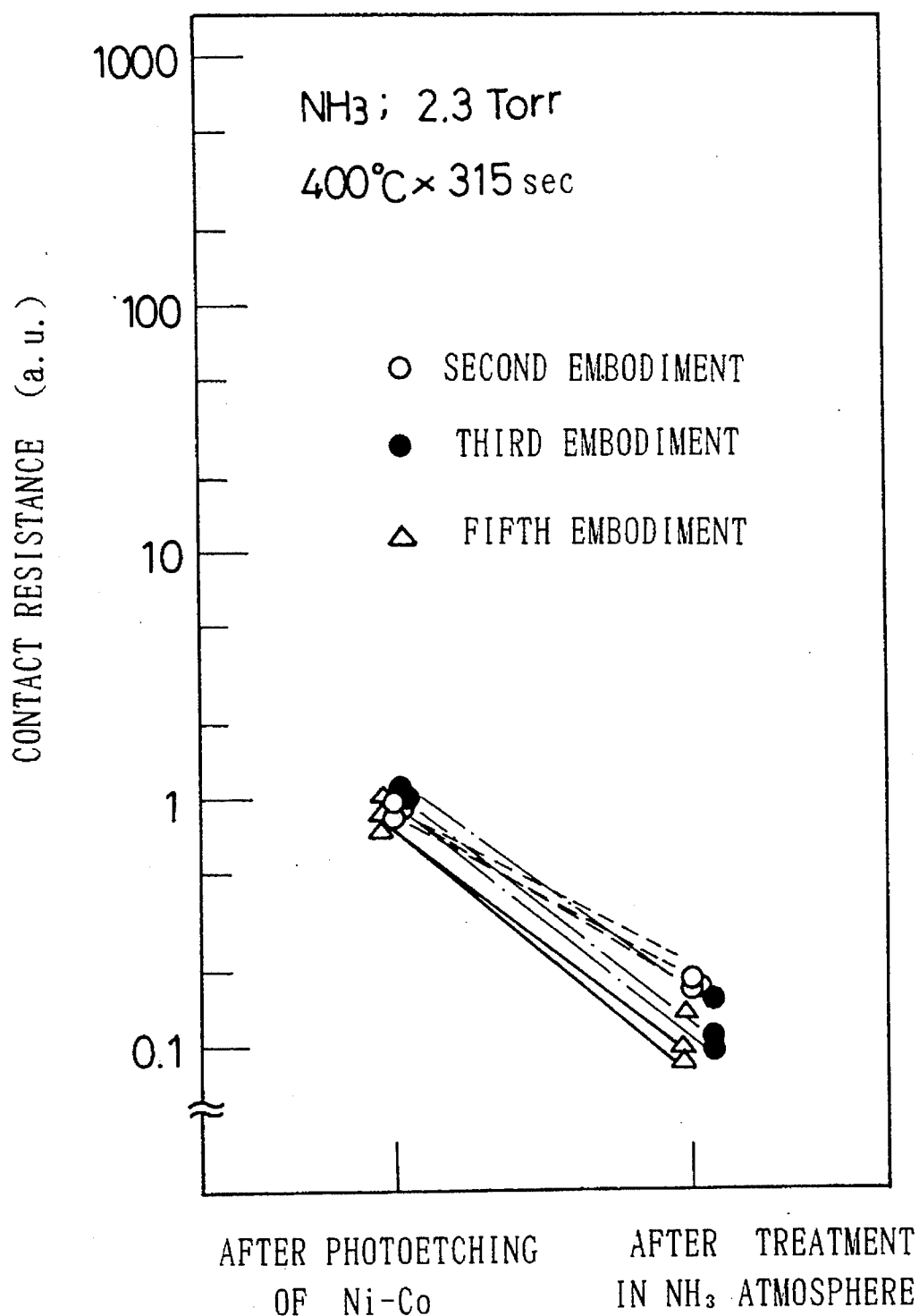
FIG. 34 is a graph showing a measurement result of the contact resistance.

FIG. 34 shows the measurement results of the contact resistance of Ni—Co/Al after the photoetching treatment of the ferromagnetic magnetoresistive element thin film 10 under the $NH_3$ gas atmosphere which is one of atmosphere gases used when the surface protection film 11 (P-SiN film) is formed, and after the plasma silicon nitride film is formed. From this figure, in the second embodiment, the increase of the contact resistance is not found out even when exposed to the $NH_3$ atmosphere.

As the conductive metal 18 of non-aluminum group conductor may be used material which does not form a nitride layer on the surface thereof when the surface protection film is formed like TiW or whose nitride film is conductive like titan nitride, and which is usable to electrically connect the ferromagnetic magnetoresistive element thin film 10 and the aluminum wiring metal 9 to each other and is not denatured by etching liquid. Accordingly, as the non-aluminum group conductor (18) may be used TiW, TiN, polycrystal silicon, noble metal such as Au, Pt or the like.

(Third Embodiment)

Next, a third embodiment will be described.

Figure 35:
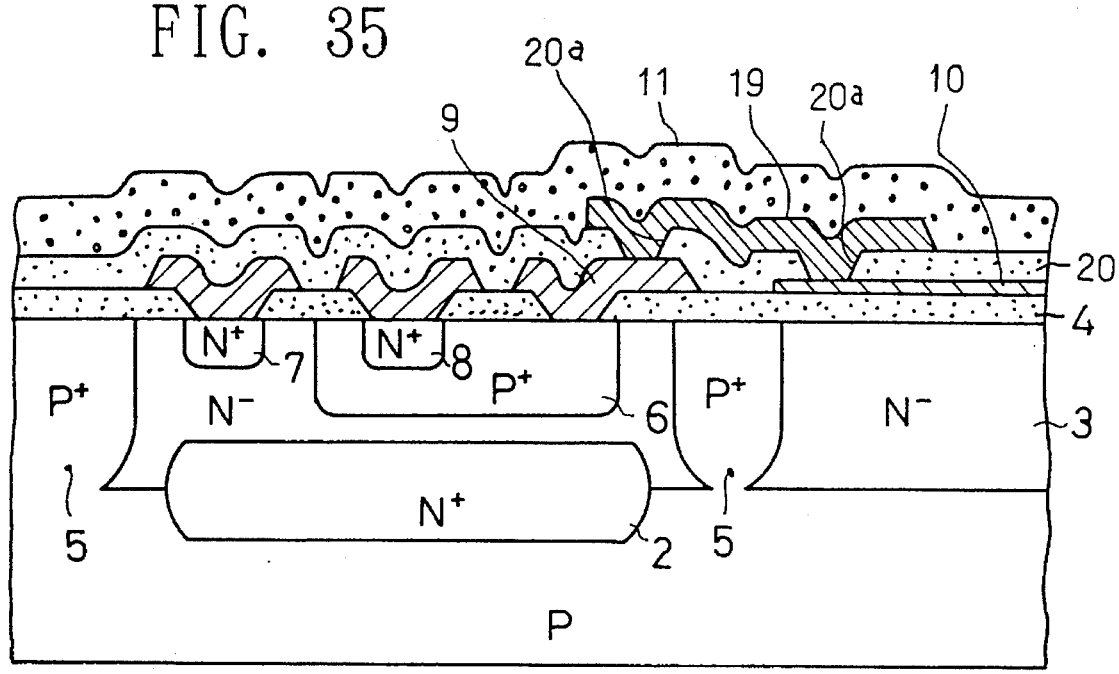
FIG. 35 is a cross-sectional view of a magnetic sensor of a third embodiment.

FIG. 35 is a cross-sectional view of the magnetic sensor of the third embodiment, and the ferromagnetic magnetoresistive element thin film 10 and the signal processing are integrated in the same substrate.

Figure 36:
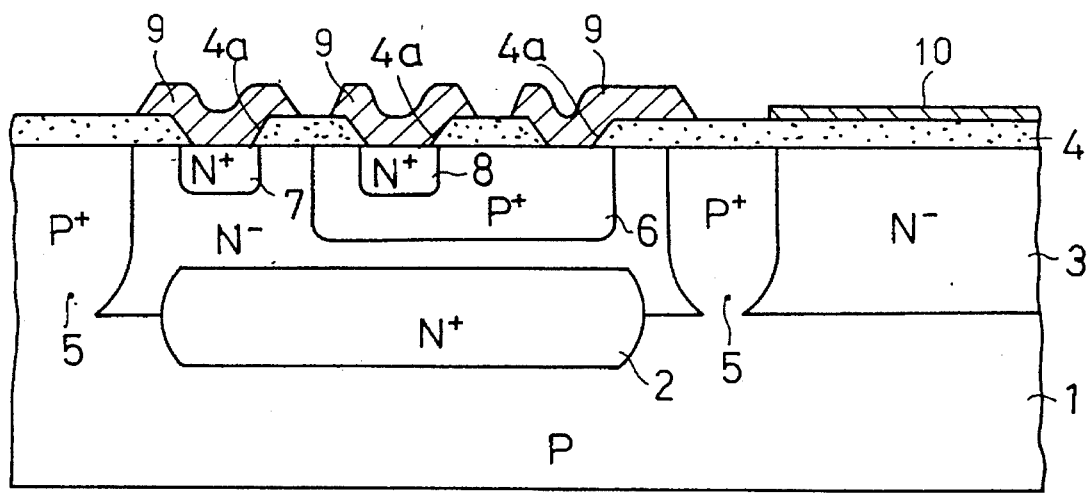
FIGS. 36 to 38 are cross-sectional views showing a manufacturing process of the magnetic sensor of the third embodiment.
Figure 37:
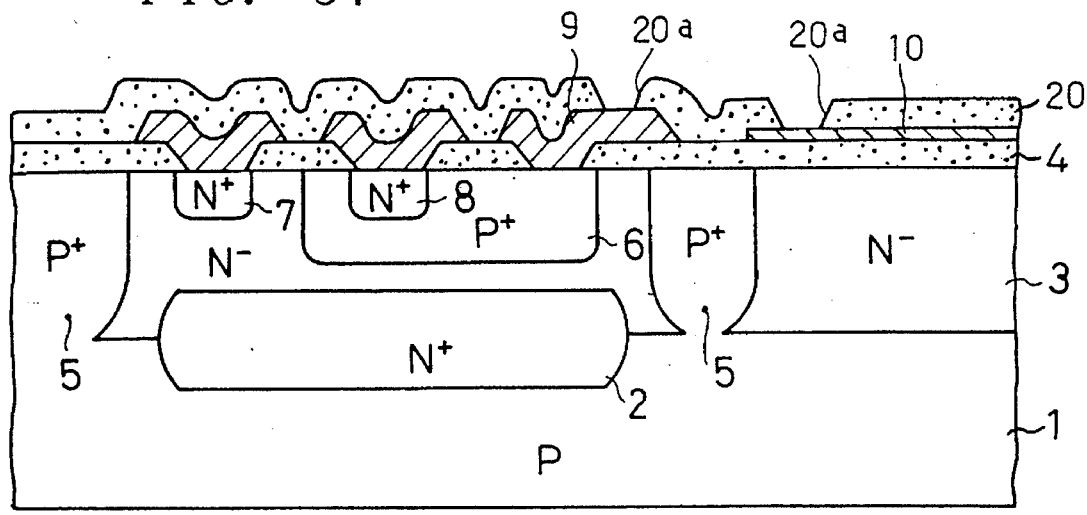
Figure 38:
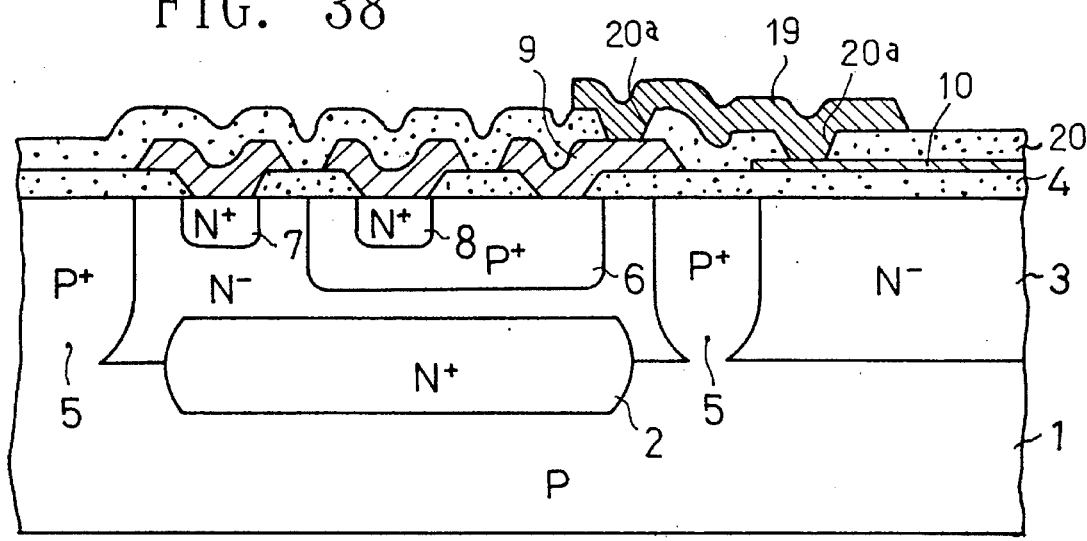

FIGS. 36 to 38 show the manufacturing process thereof.

First, as shown in FIG. 36, the NPN bipolar transistor is formed in the silicon substrate 1. Subsequently, the opening portion 4a is selectively formed on the silicon oxide film 4 to form the contact portion. Thereafter, the aluminum wiring metal 9 serving a first layer is deposited on the silicon oxide film 4, and the aluminum wiring metal 9 is patterned by the photoetching treatment. Further, the ohmic contact is made between the aluminum wiring metal 9 and the circuit element (silicon) through the heat treat treatment. Subsequently, the substrate as described above is set on the substrate holder inside of the electron beam deposition apparatus, and the ferromagnetic magnetoresistive element thin film 10 of Ni—Co is deposited by the electron beam deposition method, and patterned by the photoetching treatment. At this time, the aluminum wiring metal 9 and the ferromagnetic magnetoresistive element thin film 10 are disposed away from each other.

Subsequently, as shown in FIG. 37, the insulating film 20 of plasma silicon nitride film is deposited in about 0.5 μm thickness. An opening portion 20a is selectively formed in the insulating film 20 so as to extend to the aluminum wiring metal 9 and the ferromagnetic magnetoresistive element thin film 10 by the photolithography. In this embodiment, this opening portion 20a is formed as two contact holes, however, it may be formed as one opening hole which is formed in the neighborhood of the connection portion of the aluminum wiring metal 9 and the ferromagnetic magnetoresistive element thin film 10.

Thereafter, as shown in FIG. 38, a thin film of aluminum wiring metal 19 serving as a second layer is deposit by the sputtering method. Before deposition of the aluminum wiring metal 19, the surface of the aluminum wiring metal 9 serving as the first layer and the surface of the ferromagnetic magnetoresistive element thin film 10 are etched by an inverse-sputtering method. Subsequently, the aluminum wiring metal 19 serving as the second layer is patterned using the photolithography. As a result, the aluminum wiring metal 9 of the first layer and the ferromagnetic magnetoresistive element are electrically connected to each other through the aluminum wiring metal 19 of the second layer. The thickness of the aluminum wiring metal 9 is set to about 1 μm, and the thickness of the aluminum wiring metal 19 is set to about 5000 Å. In the patterning process of the aluminum wiring metal 19 of the second layer, an insulating film 20 is formed at the lower layer thereof, and the aluminum wiring metal 9 and the ferromagnetic magnetoresistive element thin film 10 at the lower layer side are prevented from being simultaneously etched.

Finally, as shown in FIG. 35, the surface protection film 11 of plasma silicon nitride film is formed using the plasma CVD apparatus. The result is exposed to the $NH_3$ gas which is one of the atmosphere gases in the formation process of the plasma silicon nitride film. However, an passive state is formed on the surface of the aluminum wiring metal 19 to prevent further invasion of $NH_3$, and no insulating AlN exists at the contact portion between the aluminum wiring metal 19 and the ferromagnetic magnetoresistive element thin film 10, so that as shown in FIG. 34, no increase in contact resistance is not found out in this embodiment (third embodiment) even when exposed to $NH_3$ atmosphere.

Figure 39:
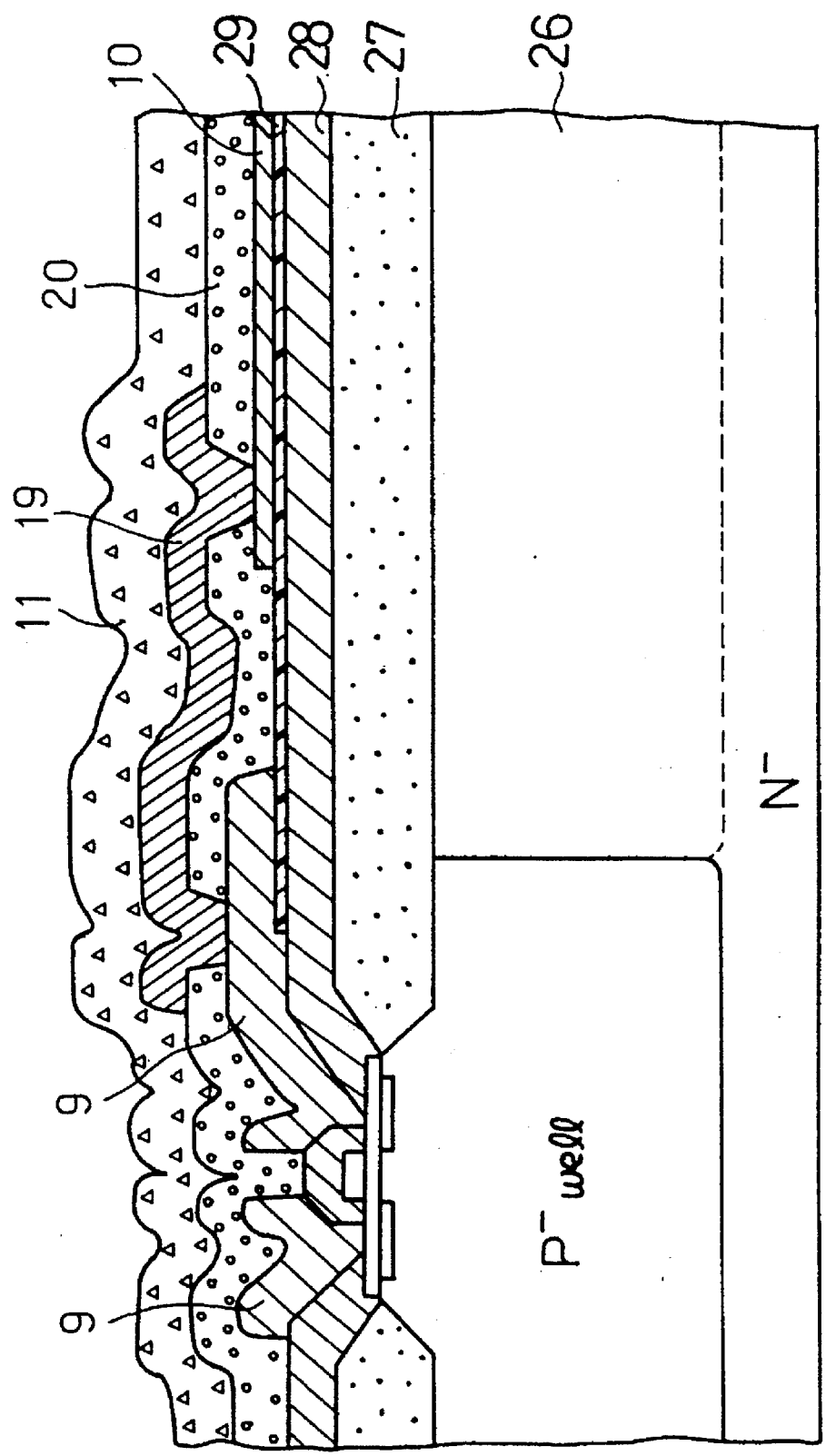
FIG. 39 is a cross-sectional view showing another embodiment of the magnetic sensor of the third embodiment.

FIG. 39 shows an example where the structure of the third embodiment is adopted on a C-MOS transistor. That is, a BPSG film 28 is formed at a main surface side of a silicon substrate 26 of a C-MOS structure through an LOCOS oxide film 27, and further a plasma silicon oxide film 29 is formed on the BPSG film 28. Subsequently, the ferromagnetic magnetoresistive element thin film 10 of Ni—Co is formed on the plasma silicon oxide film 29, and the aluminum wiring metal 19 of the second layer is superposedly disposed on the end portion of the ferromagnetic magnetoresistive element thin film 10, so that the ferromagnetic magnetoresistive element thin film 10 and the aluminum wiring metal 19 are electrically connected to each other. Further, the ferromagnetic magnetoresistive element thin film 10 and the aluminum wiring metal 19 are covered by the surface protection film 11 formed of plasma silicon nitride film. In FIG. 39, a reference numeral 20 represents an insulating film, and a reference numeral 9 represents aluminum wiring metal of first layer.

(Fourth Embodiment)

Next, a fourth embodiment will be described.

Figure 40:
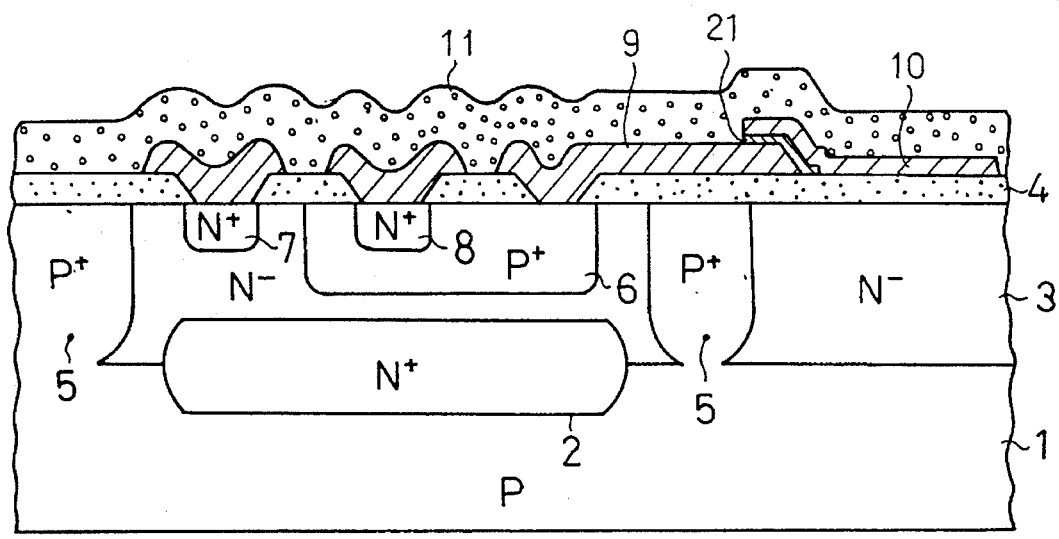
FIG. 40 is a cross-sectional view of a magnetic sensor of a fourth embodiment.

FIG. 40 is a cross-sectional view of the magnetic sensor of the fourth embodiment, and the ferromagnetic magnetoresistive element thin film 10 and the signal processing circuit are integrated in the same substrate.

Figure 41:
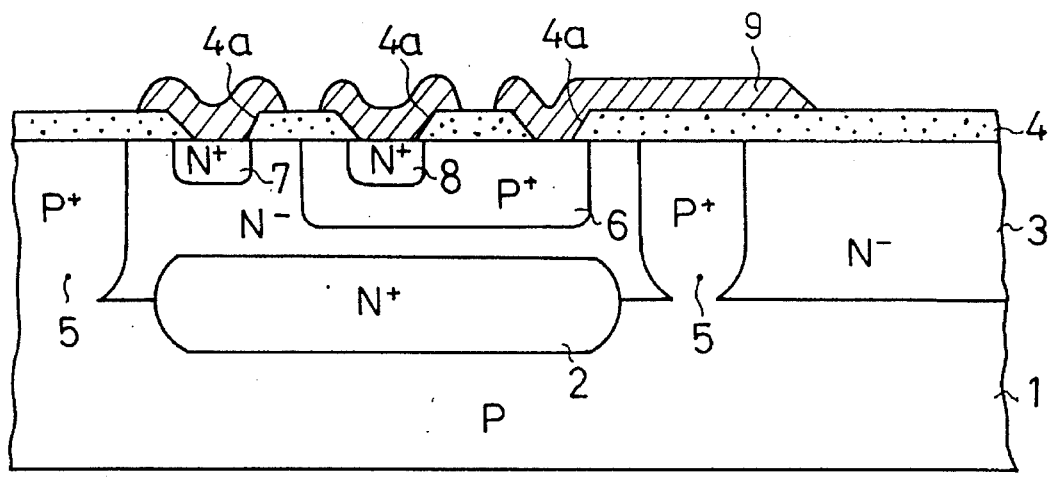
FIGS. 41 to 43 are cross-sectional views showing a manufacturing process of the magnetic sensor of the fourth embodiment.
Figure 42:
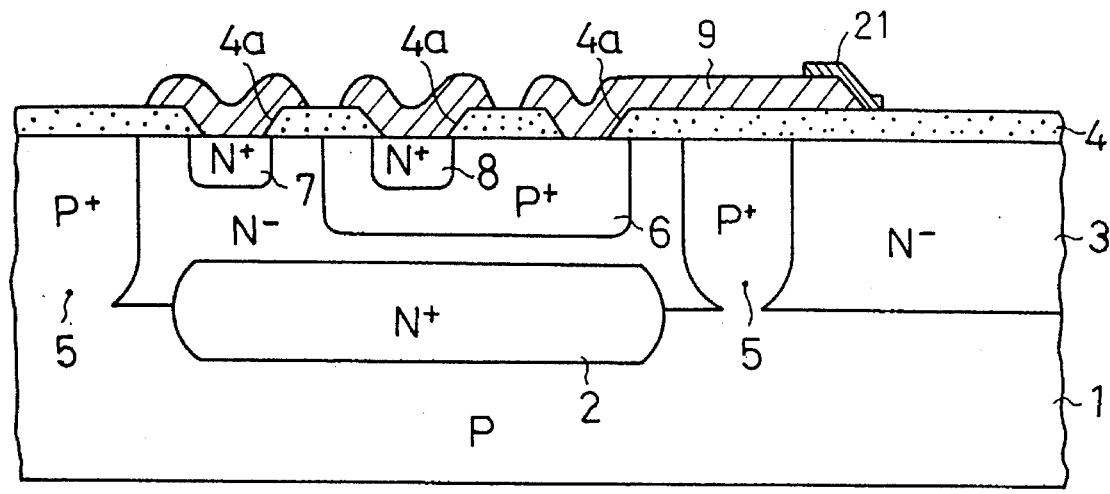
Figure 43:
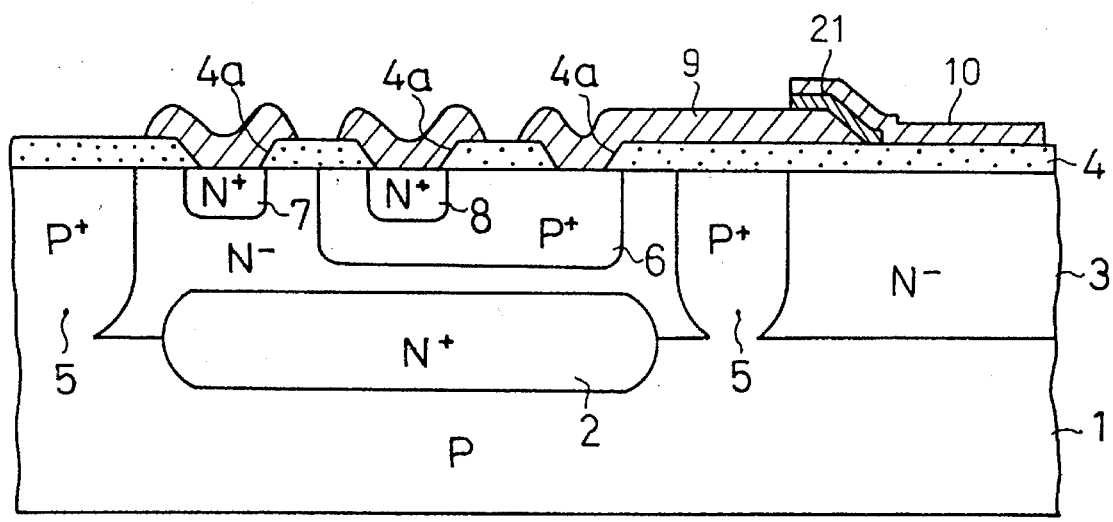

FIGS. 41 to 43 show the manufacturing process thereof.

First, as shown in FIG. 41, as described in the first embodiment, the NPN bipolar transistor for amplification is formed on the silicon substrate 1, and the opening portion 4a is selectively formed in the silicon oxide film 4 using the photolithography and the aluminum wiring metal 9 of thin film is deposited. The aluminum wiring metal 9 is patterned by the photoetching treatment to form the end portion of the aluminum wiring metal 9 in a slant shape (tapered shape) like the first embodiment. Subsequently, the ohmic contact between the aluminum wiring metal 9 and the circuit element (silicon) is made by aluminum sinter in the heat treatment process, so that the oxide film grown on the surface of the aluminum wiring metal 9 is subjected to a sputter-etching treatment.

Subsequently, a barrier metal 21 of Ti (titanium) film is deposited in thickness of 100 to 3000 Å by the deposition method or the sputtering method. As shown in FIG. 42, the barrier metal 21 is patterned by the photoetching treatment so that it remains on the slant-shaped region of the end portion of the aluminum wiring metal 9.

Thereafter, the ferromagnetic magnetoresistive element thin film 10 of Ni—Co is deposited by the deposition method. Subsequently, as shown in FIG. 43, the ferromagnetic magnetoresistive element thin film 10 is subjected to the photoetching treatment to be etched to a desired bridge pattern. At this time, the ferromagnetic magnetoresistive element thin film 10 is disposed on the end portion of the aluminum wiring metal 9 through the barrier metal 21, so that the ferromagnetic magnetoresistive element thin film 10 and the aluminum wiring metal 9 are electrically connected to each other.

Subsequently, as shown in FIG. 40, the surface protection film 11 of plasma silicon nitride film is deposited. In this formation process of the plasma silicon nitride film, the result is exposed to $NH_3$ gas which is one of the atmosphere gases, and $NH_3$ gas or $N_2$ gas penetrates through the ferromagnetic magnetoresistive element thin film 10, so that a TiN layer is formed on the surface of the barrier metal 21 at the interface between the ferromagnetic magnetoresistive element thin film 10 and the barrier metal 21. The TiN layer has excellent electrical conductivity and thus it shows no failure of conductivity unlike AlN. That is, the barrier metal 21 of Ti (titanium) film is nitride to form nitride of Ti (titanium). However, the volume resistivity of Ti (titanium) is decreased through a nitriding process of Ti (titanium), and thus no failure of conductivity occurs at this portion. As described above, the surface of the aluminum wiring metal 9 is not nitride through the nitriding process of the barrier metal 21. Therefore, the contact resistance between the ferromagnetic magnetoresistive element thin film 10 and the aluminum wiring metal 9 can be inhibited from increasing due to formation of the surface protection film.

As described above, in this embodiment, the barrier metal 21 of Ti (titanium) film is laminated between the ferromagnetic magnetoresistive element thin film 10 and the aluminum wiring metal 9 on the P-type semiconductor substrate 1 to electrically connect the ferromagnetic magnetoresistive element thin film 10 and the aluminum wiring metal 9 to each other, and the ferromagnetic magnetoresistive element thin film 10 and the aluminum wiring metal 9 are covered by the surface protection film 11 formed of plasma silicon nitride film.

Therefore, the barrier metal 21 is disposed in a laminate state between the ferromagnetic magnetoresistive element thin film 10 and the aluminum wiring metal 9, and the barrier metal 21 is nitride under the $NH_3$ gas atmosphere when the plasma silicon nitride film is formed. However, this nitride has low resistance, and thus the increase in contact resistance is inhibited.

In this embodiment, the Ti (titanium) film is used as the barrier metal, however, Zr (zirconium) or the like may be used. In short, there may be used material which is not liable to be nitride by aluminum-based wiring metal, and even when it is nitride, it has low resistance and conductive.

Figure 44:
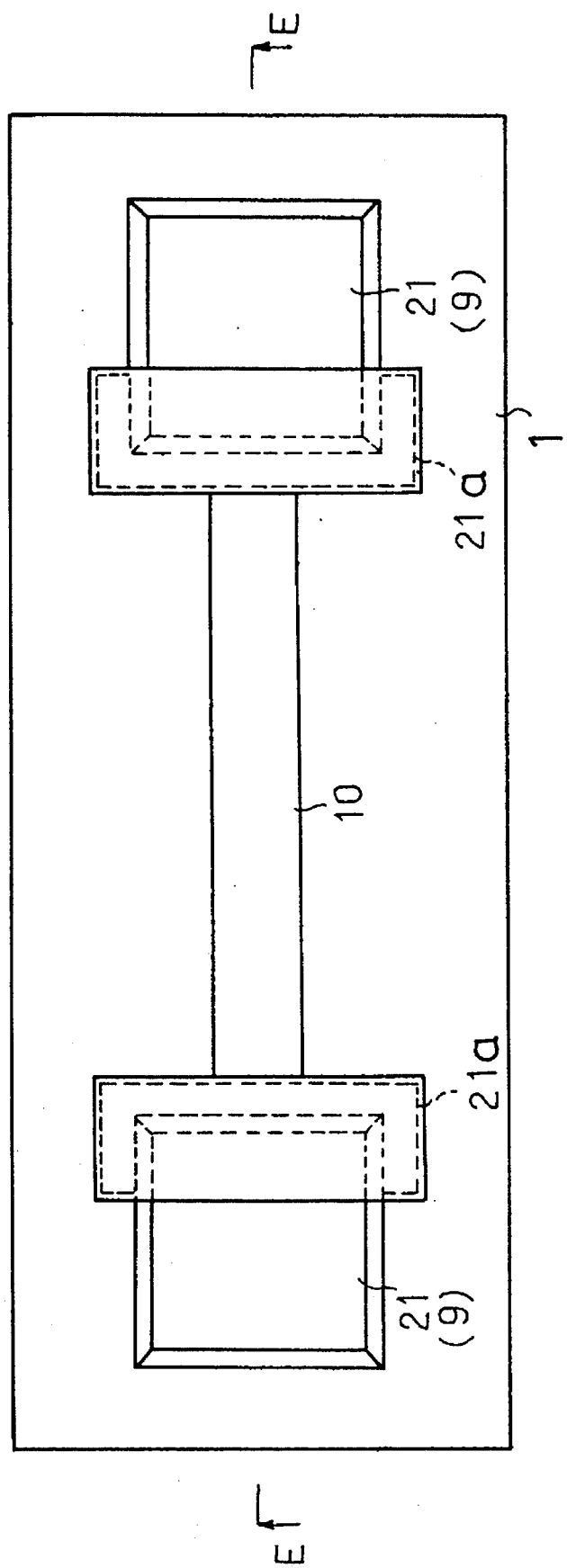
FIG. 44 is a plane view of a magnetic sensor of a modification of the fourth embodiment.
Figure 45:
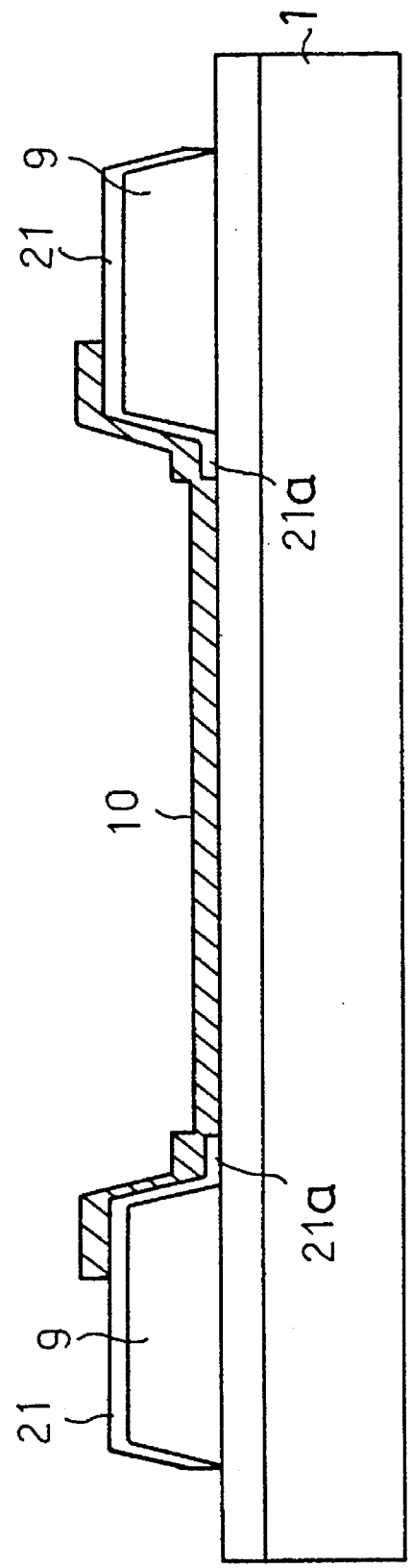
FIG. 45 is a E—E cross-sectional view of the magnetic sensor.

Further, as a modification of this embodiment, it may be embodied as shown in FIGS. 44 and 45. That is, FIG. 44 is a plane view on the substrate 1, and FIG. 45 is an E—E cross-sectional view. In this modification, the barrier metal 21 is formed over the whole aluminum wiring metal 9, and a draw-out portion 21a of the barrier metal 21 is provided on the substrate 1 so as to extend from the barrier metal 21.

(Fifth Embodiment)

Next, a fifth embodiment will be described.

Figure 46:
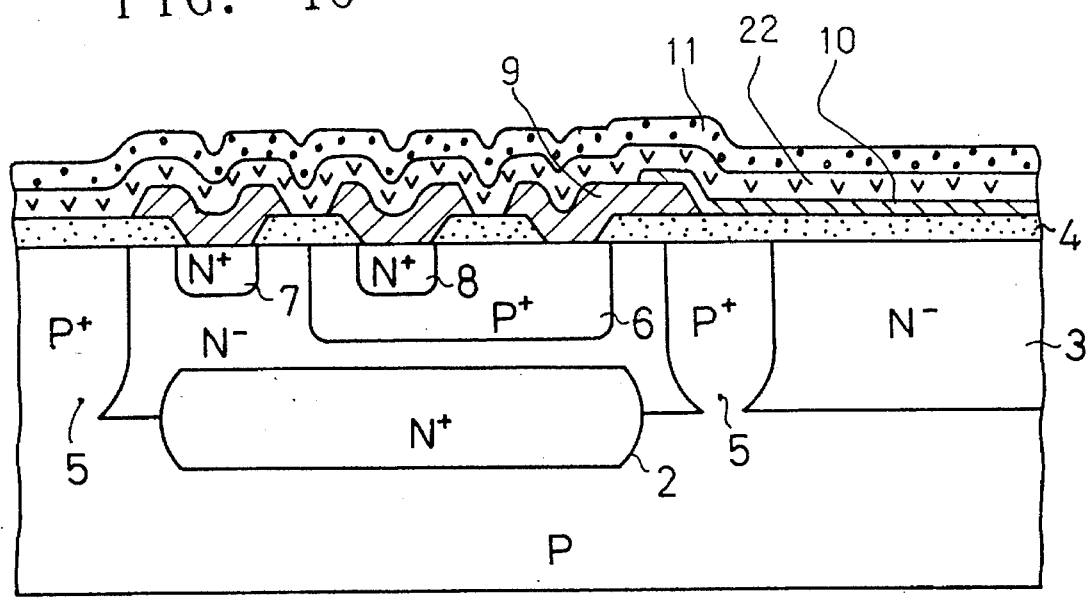
FIG. 46 is a cross-sectional view of a magnetic sensor of a fifth embodiment.

FIG. 46 is a cross-sectional view of the magnetic sensor of the fifth embodiment, and the ferromagnetic magnetoresistive

- 40 element thin film 10 and the signal processing circuit are integrated in the same substrate.

Figure 47:
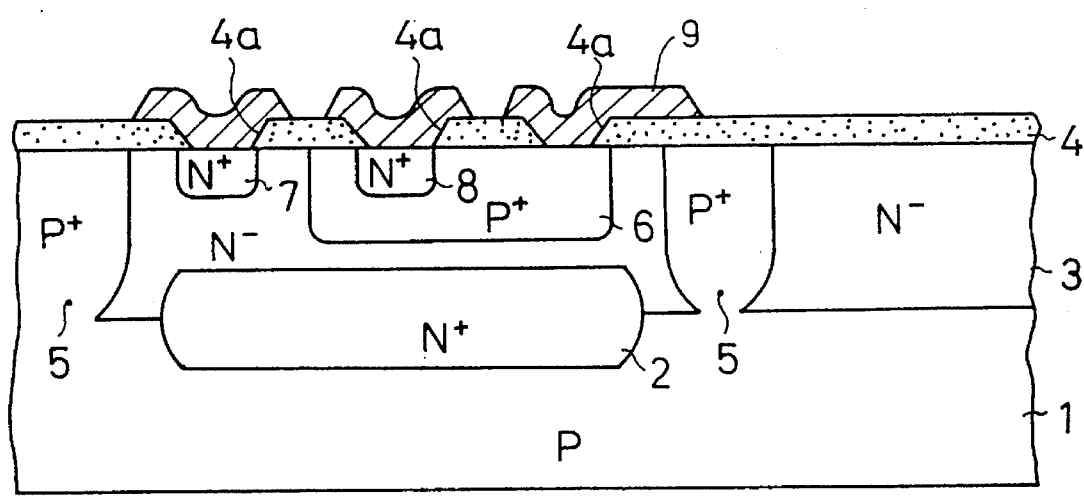
FIGS. 47 to 49 are cross-sectional views of a manufacturing process of the magnetic sensor of the Fifth embodiment.
Figure 48:
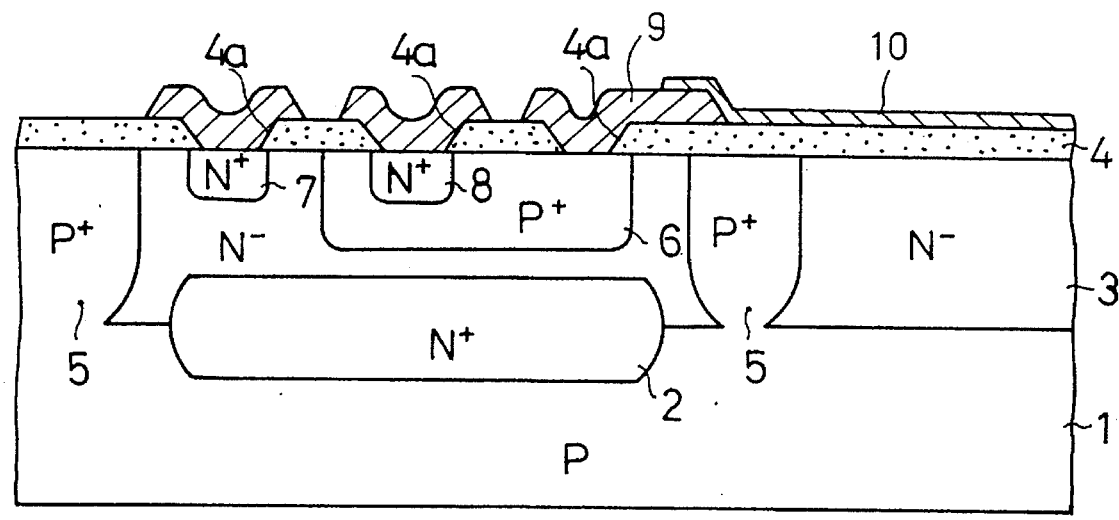
Figure 49:
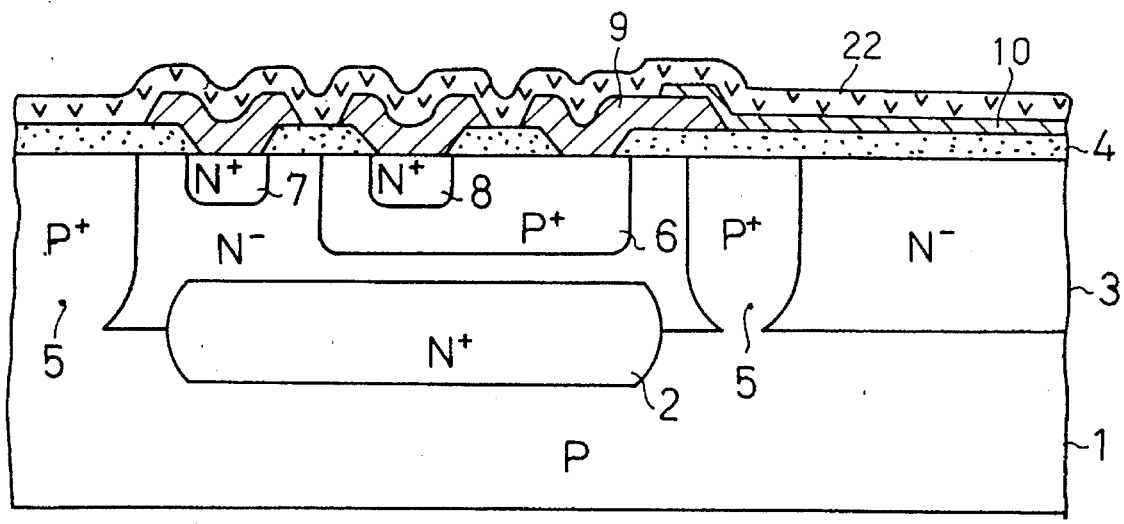

FIGS. 47 to 49 show the manufacturing process thereof.

First, as shown in Fig, 47, like the various embodiments as described above, the NPN bipolar transistor is formed, the opening portion 4a is selectively formed in the silicon oxide film 4 using the photolithography, and the thin film of aluminum wiring metal 9 is deposited on the main surface of the P-type semiconductor substrate 1. The aluminum wiring metal 9 is patterned by the photoetching treatment. At this time, the end portion of the aluminum wiring metal 9 is designed in a slant shape (tapered shape). Thereafter, the ohmic contact is made between the aluminum wiring metal 9 and the circuit element (silicon) in the heat treatment process.

After this sinter process of Al (heat treatment process), the substrate as described above is set on the substrate holder inside of the vacuum chamber to etch the oxide layer grown on the surface of the aluminum wiring metal 9 by the sputter etching of inert gas (for example, Ar gas). Thereafter, as shown in FIG. 48, in the same vacuum chamber, the ferromagnetic magnetoresistive element thin film 10 of Ni—Co is subjected to the electron beam deposition while keeping the vacuum state. Subsequently, the ferromagnetic magnetoresistive element thin film 10 is etched to a desired bridge pattern by the photoetching method. At this time, the ferromagnetic magnetoresistive element thin film 10 is disposed on the end portion of the aluminum wiring metal 9.

Subsequently, as shown in FIG. 49, the silicon oxide film 22 is deposited by the sputtering method, and as shown in FIG. 46, the surface protection film 11 of plasma silicon nitride film is deposited. In this process of forming the plasma silicon nitride film, the result is exposed to $NH_3$ gas which is one of the atmosphere gases, however, the invasion of $NH_3$ is prevented by the silicon oxide film 22, so that no insulating AlN is formed at the contact portion between the ferromagnetic magnetoresistive element thin film 10 and the aluminum wiring metal 9.

Therefore, according to the magnetic sensor thus manufactured, the ferromagnetic magnetoresistive element thin film 10 of Ni—Co and the aluminum wiring metal 9 are disposed on the P-type semiconductor substrate 1, and the ferromagnetic magnetoresistive element thin film 10 and the aluminum wiring metal 9 are electrically connected to each other. In addition, the ferromagnetic magnetoresistive element thin film 10 and the aluminum wiring metal 9 are covered with the silicon oxide film 22, and the silicon oxide film 22 is covered by the surface protection film 11 of plasma silicon nitride film.

As a result, as shown in FIG. 34, the increase in contact resistance is not found out in the fifth embodiment even when exposed to the $NH_3$ atmosphere. That is, the invasion of $NH_3$ is prevented by the silicon oxide film 22 under the $NH_3$ gas atmosphere when the surface protection film (plasma silicon 42 nitride film) 11 is formed, and no insulating AlN exists at the contact portion between the ferromagnetic magnetoresistive element thin film 10 and the aluminum wiring metal 9. Therefore, using the silicon oxide film 22, the increase of contact resistance of Ni—Co/Al due to the film formation of P—SiN can be inhibited.

The silicon oxide film 22 serving as the insulating film may be formed by the electron beam deposition method in place of the sputtering method, and a plasma SiO or a TEOS (tetraethoxy silane) film may be used for the plasma method. Further, in place of the silicon oxide film 22, an amorphous silicon film by CVD may be used.

This invention is not limited to the above embodiments. For example, in the above embodiments, Ni—Co is used for the ferromagnetic magnetoresistive element thin film, however, another ferromagnetic magnetoresistive element thin film, particularly a Ni-based thin film (Ni—Fe, Ni—Fe—Co, or the like) may be used. Further, as the aluminum-based wiring metal may be used not only pure aluminum, but also aluminum group material such as Al—Si, Al—Si—Cu or the like.

Further, in the above embodiments, the silicon nitride film ($Si_xN_y$) is described as the surface protection film. However, another nitride film such as SiON or the like may be used as the protection film. Further, as the protection film, the upper layer of the above nitride film may be covered by a polyimide film as a final protection film.

Still further, in the above embodiments, the aluminum wiring is subjected to the plasma etching treatment to purify the surface thereof after the heat treatment process (sinter process). However, the aluminum surface is easily formed with an oxide layer by washing it even when the surface of aluminum may be exposed to the outside air, and thus these oxide layers containing the above oxide layer may be removed before the ferromagnetic magnetoresistive element thin film 10 is formed.

Still further, the above various embodiments are described with respect to the magnetic sensor formed on the bipolar transistor. However, these embodiments may be applied to a magnetic sensor which is integrated with an MOSFET such as C-MOS, N-MOS, Bi-CMOS or the like. Further, these embodiments may be applied to a discrete magnetic sensor which is so designed as to be formed on a silicon substrate formed with a glass substrate and an insulating layer.

INDUSTRIAL APPLICABILITY

As described above, according to the magnetoresistive element of this invention, even when the surface protection film is formed of silicon nitride, the increase in contact resistance between the magnetoresistive element thin film and the wiring metal due to the formation of the surface protection film can be inhibited, and thus the magnetoresistive element thin film having low contact resistance can be obtained. Accordingly, the resistance value of the magnetoresistive element can be accurately obtained, and silicon nitride having excellent moisture-resistance as the surface protection film can be used. Therefore, the magnetic sensor using this magnetoresistive element thin film is very effectively applied to the case where it is integrated with a controlling or amplifying semiconductor element in the same substrate.

We claim:

1. A magnetoresistive element comprising:

an aluminum-based wiring metal disposed on said substrate;

a nickel-based magnetoresistive element thin film disposed on said substrate such that a portion of said nickel-based magnetoresistive element thin film overlaps a portion of said aluminum-based wiring metal, said nickel-based magnetoresistive element thin film being electrically connected to said aluminum-based wiring metal at said overlap;

a barrier film disposed between said nickel-based magnetoresistive element thin film and said aluminum-based wiring metal to protect said aluminum-based wiring metal from nitrogen, wherein said barrier film is an alloy layer of said nickel-based magnetoresistive element thin film and said aluminum-based wiring metal; and a surface protection film of nitride that covers said nickel-based magnetoresistive element thin film.

2. A magnetoresistive element comprising:

a substrate;

an aluminum-based wiring metal disposed on said substrate;

a nickel-based magnetoresistive element thin film disposed on said substrate such that a portion of said nickel-based magnetoresistive element thin film overlaps a portion of said aluminum-based wiring metal, said nickel-based magnetoresistive element thin film being electrically connected to said aluminum-based wiring metal at said overlap, wherein an end portion of said aluminum-based wiring metal at said overlap defines a contact portion between said nickel-based magnetoresistive element thin film and said aluminum-based wiring metal, said end portion of said aluminum-based wiring metal having beveled edges and having a recessed portion defined therein so as to maximize a length of said contact portion a barrier film disposed between said nickel-based magnetoresistive element thin film and said aluminum-based wiring metal to protect said aluminum-based wiring metal from nitrogen; and a surface protection film of nitride that covers said nickel-based magnetoresistive element thin film.

3. A magnetoresistive element comprising:

a substrate;

an aluminum-based wiring metal disposed on said substrate and having a connection region defined thereon;

a nickel-based magnetoresistive element thin film disposed on said substrate such that a portion of said nickel-based magnetoresistive element thin film overlaps at least a portion of said connection region of said aluminum-based wiring metal;

a barrier film disposed between said nickel-based magnetoresistive element thin film and said aluminum-based wiring metal, said barrier film having a consistency such that said barrier film is impermeable to nitrogen, wherein said barrier film is a aluminum-based metal film which covers said connection region; and a surface protection film of nitride that covers said nickel-based magnetoresistive element thin film.

4. The magnetoresistive element according to claim 3, wherein said aluminum-based metal film serves as an electrically connecting member between said nickel-based magnetoresistive element thin film and said aluminum-based wiring metal.

5. A magnetoresistive element comprising:

a substrate;

an aluminum-based wiring metal disposed on said substrate and having a connection region defined thereon;

a nickel-based magnetoresistive element thin film disposed on said substrate such that a portion of said nickel-based magnetoresistive element thin film overlaps at least a portion of said connection region of said aluminum-based wiring metal, wherein said connection region is located at an end portion of said aluminum-based wiring metal at said overlap between said nickel-based magnetoresistive element thin film and said aluminum-based wiring metal, said end portion of said aluminum-based wiring metal having beveled edges and having a recessed portion defined therein so as to maximize a length of said connection region;

a barrier film disposed between said nickel-based magnetoresistive element thin film and said aluminum-based wiring metal, said barrier film having a consistency such that said barrier film is impermeable to nitrogen; and a surface protection film of nitride that covers said nickel-based magnetoresistive element thin film.

6. A magnetoresistive element comprising:

a substrate;

an aluminum-based wiring metal disposed on said substrate;

a nickel-based magnetoresistive element thin film disposed on said substrate;

a connection conductor which electrically connects said aluminum-based wiring metal to said nickel-based magnetoresistive element thin film and is disposed at a first side of said aluminum-based wiring metal and a first side of said nickel-based magnetoresistive element thin film, wherein said first side of said aluminum-based wiring metal is a side of said aluminum-based wiring metal proximate to said substrate, and said first side of said nickel-based magnetoresistive element thin film is a side of said nickel-based magnetoresistive element thin film proximate to said substrate; and a surface protection film of nitride that covers said nickel-based magnetoresistive element thin film.

7. The magnetoresistive element according to claim 6, wherein said connection conductor is a selected from a group consisting of titanium tungsten, titanium nitride, polycrystalline silicon, gold and platinum.

8. A magnetoresistive element comprising:

a substrate;

an aluminum-based wiring metal disposed on said substrate, an upper surface of said aluminum-based wiring metal including a contacting portion;

a nickel-based magnetoresistive element thin film disposed on said substrate and on said contacting portion of said aluminum-based wiring metal such that said nickel-based magnetoresistive element thin film is electrically connected to said aluminum-based wiring metal, wherein said contacting portion is located at an end portion of said aluminum-based wiring metal at an overlap between said nickel-based magnetoresistive element thin film and said aluminum-based wiring metal, said end portion of said aluminum-based wiring metal having beveled edges and having a recessed portion defined therein so as to maximize a length of said contacting portion;

a barrier film interposed said nickel-based magnetoresistive element thin film and said aluminum-based wiring metal at said contacting portion, said barrier film having a consistency such that said barrier film is impermeable to nitrogen; and a surface protection film of nitride that covers said nickel-based magnetoresistive element thin film.

* * * * *